(12) United States Patent
Nonomura et al.

(10) Patent No.: US 6,600,137 B1
(45) Date of Patent: Jul. 29, 2003

(54) HEATING DEVICE AND HEATING METHOD

(75) Inventors: Masaru Nonomura, Yamanashi (JP);
Toshihiro Abe, Yamanashi (JP);
Nobuyasu Nagafuku, Kofu (JP);
Kuniyo Matsumoto, Yamanashi (JP);
Takashi Sasaki, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/807,472

(22) PCT Filed: Oct. 13, 1999

(86) PCT No.: PCT/JP99/05632
§ 371 (c)(1),
(2), (4) Date: Apr. 13, 2001

(87) PCT Pub. No.: WO00/22898
PCT Pub. Date: Apr. 20, 2000

(30) Foreign Application Priority Data

Oct. 13, 1998 (JP) ............................................. 10/290352
Oct. 13, 1998 (JP) ............................................. 10/290356

(51) Int. Cl.⁷ .......................... F27D 11/00; B23K 1/00; B23K 35/38; F27B 9/28
(52) U.S. Cl. .................. 219/388; 219/388; 219/390; 228/42; 228/219; 432/8; 432/59; 432/120
(58) Field of Search .......................... 228/26, 2.1, 18, 228/40, 42, 206, 219; 217/388, 390; 432/8, 59, 48, 120

(56) References Cited

U.S. PATENT DOCUMENTS

| 4,321,031 A | * | 3/1982 | Woodgate | 219/388 |
| 4,876,437 A | * | 10/1989 | Kondo | 219/388 |
| 4,951,401 A | * | 8/1990 | Suzuki et al. | 34/77 |
| 5,172,847 A | * | 12/1992 | Barten et al. | 228/18 |
| 5,356,066 A | * | 10/1994 | Yamada | 228/42 |
| 5,440,101 A | * | 8/1995 | Cox et al. | 219/388 |
| 5,467,912 A | | 11/1995 | Mishina et al. | |
| 5,573,688 A | * | 11/1996 | Chanasyk et al. | 219/388 |
| 5,611,476 A | * | 3/1997 | Soderlund et al. | 228/219 |
| 5,683,242 A | * | 11/1997 | Cronin et al. | 432/144 |
| 6,116,895 A | * | 9/2000 | Onuschak | 432/120 |
| 6,120,585 A | * | 9/2000 | Inomata et al. | 55/315.1 |
| 6,354,481 B1 | * | 3/2002 | Rich et al. | 134/105 |
| 6,382,497 B1 | * | 5/2002 | Nagafuku et al. | 228/102 |
| 6,488,076 B1 | * | 12/2002 | Yasuda et al. | 219/388 |

FOREIGN PATENT DOCUMENTS

| JP | 63-101171 | | 7/1988 |
| JP | 5-65470 | | 8/1993 |
| JP | 6-61640 | | 3/1994 |
| JP | 6-170524 | | 6/1994 |
| JP | 08-293666 A | * | 11/1996 |
| JP | 10-200252 | | 7/1998 |

* cited by examiner

Primary Examiner—Tom Dunn
Assistant Examiner—L. Edmondson
(74) Attorney, Agent, or Firm—Wenderoth, Lind & Ponack, L.L.P.

(57) ABSTRACT

The quantity of supply heat of heated gas is controlled so that a supply heat quantity of the heated gas when no heat treatment of solder or the like is needed is made smaller than a supply heat quantity of the heated gas when heat treatment of solder or the like is needed, reducing consumption power when no heat treatment is needed for a board.

55 Claims, 22 Drawing Sheets

US 6,600,137 B1

HEATING DEVICE AND HEATING METHOD

TECHNICAL FIELD

The present invention relates to a heating apparatus and heating method for hardening an object to be heated located on an object to be bonded (bonding base object) or, for example, a bonding material for bonding an electronic component to the bonding base object, or more specifically for performing, for example, heating of a solder for solder-bonding, hardening of an electronic component fixing use thermosetting adhesive, or hardening of an encapsulation resin of an electronic component (IC chip, etc.), for example, in a process such as a process for mounting an electronic component onto a bonding base object (object to be bonded) such as a circuit board, a component, or a wafer via a bonding material, a process for bonding a board for interposer in a wafer state to a wafer via a bonding material such as a solder bump, or a process for forming a bonding material such as a bump for mounting a component in a state in which no component is mounted.

BACKGROUND ART

In recent years, a technique for mounting an electronic component on a circuit board requires multilayered circuit board, finer mounting density, dual-side mounting, and so on, while there is a growing demand for reducing the consumption power of the apparatus from the point of view of global environment.

Conventionally, in a reflow apparatus for soldering an electronic component onto a circuit board, there has been a heating apparatus that uses heating by a gas heated to a specified temperature, heating by radiant heat of infrared rays or the like, or a combination of them. However, the heating apparatus principally provides heat transfer by the gas heated to a specified temperature, and a variety of methods for circulating the heated gas are devised according to the conventional reflow method and reflow apparatus.

However, fabrication cannot be performed until reaching a specified temperature when a reduction in consumption power is considered. Therefore, it is required to achieve a reduction in consumption power in the operative stage of fabrication and achieve a reduction in consumption power in the inoperative stage of fabrication.

As a prior art example relevant to the method of circulating the heated gas, the method disclosed in Japanese Unexamined Patent Publication No. 6-61640 will be described with reference to FIG. 10, FIG. 11, FIG. 12, and FIG. 13.

The conventional reflow apparatus has a conveyance section 90b for conveying a circuit board 90a from an entrance to an exit, a preheating chamber 90f, a reflow heating chamber 90h, an air circulation path 90c in which air is circulated by a sirocco fan 90d, and an air heating device 90e provided for each air circulation path 90c. It is to be noted that the preheating chamber 90f and the reflow heating chamber 90h are collectively referred to as a furnace section.

The circuit board 90a receives thereon a printed solder paste, receives an electronic component mounted on the printed solder paste, and is conveyed through the reflow apparatus by the conveyance section 90b. In each air circulation path 90c, each sirocco fan 90d circulates a specified amount of air, and the air heating device 90e heats the specified amount of circulating air to a specified temperature. Through the above-mentioned processes, the circuit board 90a conveyed to the conveyance section 90b is heated by receiving on its upper surface the circulating air heated to the respective specified temperatures of the preheating chambers 90f and the reflow heating chambers 90h arranged from the entrance toward the exit. The board is preheated to a specified temperature in the preheating chambers 90f, then heated in a reflow manner to a specified temperature for reflow soldering in the reflow heating chambers 90h, and finally cooled by receiving cooling air in a cooling chamber 90g.

However, in the aforementioned prior art construction, as shown in FIG. 12, a flow rate Q1 of the circulating air heated to the respective temperatures of the chambers is constant regardless of the operating state of the apparatus as to, for example, whether the temperature inside the apparatus is in a stable state (state in which a READY signal that is a loading enable signal is ON) at a specified temperature or in an adjusting state (state in which the READY signal that is the loading enable signal is OFF) as well as the presence or absence of a board inside the apparatus. This becomes a factor for increasing and consuming a time for the attainment of the stable state inside the furnace and consumption power.

FIG. 12 and FIG. 13 show timing charts of the operation of the apparatus to the attainment of the stable state inside the furnace. It is assumed that the heating chamber has the specified temperatures of a low setting temperature and a high setting temperature of t1 and t2, respectively, and t1<t2. If the atmospheric temperature inside the heating chamber is changed from the low temperature t1 to the high temperature t2 by changing the specified setting temperature of the heating chamber from the low temperature t1 to the high temperature t2 as shown in FIG. 12, then the furnace wall temperature of wall surfaces (heat insulator of, for example, calcium silicate) that constitute the heating chamber reaches the high temperature t2 later than the atmospheric temperature inside the heating chamber due to the influence of the thermal capacity and the rate of heat transfer. Conversely, if the atmospheric temperature inside the heating chamber is changed from the high temperature t2 to the low temperature t1 by changing the specified setting temperature of the heating chamber from the high temperature t2 to the low temperature t1 as shown in FIG. 13, then the furnace wall temperature of the wall surfaces that constitute the heating chamber also reaches the low temperature t1 later than the atmospheric temperature is inside the heating chamber due to the influence of the rate of heat transfer.

If a circuit board is heated immediately after the atmospheric temperature inside the heating chamber has reached the specified temperature, then there occurs a large difference in heating temperature by comparison with the stabilized stage since the furnace wall temperature is not stabilized, causing variations in quality. Therefore, by providing a time for stabilizing the furnace wall temperature (for example, after a lapse of a specified time (about 30 minutes to 45 minutes) by a timer after the atmospheric temperature has reached the specified temperature in FIG. 12 and FIG. 13) and forming an output of a loading enable signal of the circuit board into the apparatus (i.e., by turning on the READY signal that is the loading enable signal), the variations in quality of the circuit boards are restrained. However, according to this method, the time required for the furnace wall temperature to reach the specified temperature is long, and the time necessary from the temperature setting change to the enabling of heating is long, also causing an increase in consumption power during the time.

Furthermore, when the apparatus is in a heatable condition, the specified amount of heated air, which is required for maintaining the temperature of the atmosphere inside the furnace constant even when no circuit board exists inside the apparatus and controlling the variations in heating temperature of each circuit board when the circuit board is loaded, is circulated, and therefore, consumption power at the time when no circuit board is loaded in the apparatus is increased.

As shown in FIG. 33, a general conveyance section 90b is constructed of a fixed rail section 90i and a movable rail section 90j. The movable rail section 90j, which is supported in engagement by a screw 90k via a nut 90l by the rotation of a motor 90w and made slidable in a direction in which the movable rail section comes close to or away from the fixed rail section 90i, can cope with the width dimension (for example, 50 to 460 mm) of a variety of circuit boards 90a. Therefore, an opening 90m located between the chambers and at loading entrance and unloading exit of the apparatus has the maximum dimension (for example, 460 mm) or more of the circuit board 90a that can be conveyed.

However, in the aforementioned prior art example, the circulating air heated to the respective specified temperatures of the chambers will disadvantageously cause thermal interference through the opening located between the chambers and at the loading entrance and unloading exit of the apparatus. Therefore, each air heating device must supply a large quantity of heat, and this becomes a factor for increasing the consumption power. FIG. 34 shows the principle of the above-mentioned thermal interference. Assuming that heated air temperatures of adjoining two chambers 90n and 90o out of a preheating chamber, a heating chamber, and a cooling chamber are t1 and t2, respectively, and t1<t2, then air of the low temperature t1 flows into the chamber 90o. Particularly above the fixed rail section 90i and the movable rail section 90j, there is a consistent flow of air along the upper surfaces of the rail sections. Before the loading of a circuit board, a stable thermal equilibrium is provided after a lapse of a specified time. However, if a circuit board is loaded, then the air temperature is largely disordered and slowly restored into the stable state. Furthermore, if circuit boards are continuously loaded and the next circuit board is disadvantageously loaded before the restoration into the stable state, then the heating temperature is disadvantageously varied every circuit board, causing variations in quality.

As described above, an increase in consumption power is the issue with regard to any of the disadvantageous matters, and this has been demanded to be reduced.

Accordingly, the present invention has the object of providing a heating apparatus and heating method capable of reducing consumption power, giving solution to the aforementioned issues.

DISCLOSURE OF INVENTION

In order to achieve the aforementioned object, the present invention is constructed as follows.

According to a first aspect of the present invention, there is provided heating apparatus comprising:

a conveyance section for conveying a bonding base object to which an electronic component is bonded via an object to be heated;

a heating chamber for heating the object to be heated on the bonding base object by supplying at a specified flow rate heated gas heated to a specified temperature by a heating device as a heating source onto the bonding base object conveyed by the conveyance section; and a gas supply heat quantity control unit for controlling the quantity of heat of the gas so that a supply heat quantity of the gas when no heat treatment for the object to be heated is needed is made smaller than a supply heat quantity of the gas when heat treatment for the object to be heated is needed.

According to a second aspect of the present invention, there is provided a heating apparatus as defined in the 1st aspect, wherein the gas supply heat quantity control unit makes the quantity of supply heat of the gas when no heat treatment for the object to be heated is needed smaller than the quantity of supply heat of the gas when heat treatment for the object to be heated is needed and controls the supply heat quantity of the gas so as to increase the supply heat quantity of the gas when setting changing of a temperature of the heating chamber to another specified temperature is executed further than the supply heat quantity of the gas when setting changing of the temperature of the heating chamber is not executed.

According to a third aspect of the present invention, there is provided a heating apparatus as defined in the 1st aspect, wherein the gas supply heat quantity control unit is a gas flow rate control unit, which makes the quantity of supply heat of the gas when no heat treatment for the object to be heated is needed smaller than the quantity of supply heat of the gas when heat treatment for the object to be heated is needed and controls the supply heat quantity of the gas so as to increase a supply flow rate of the gas when setting changing of a temperature of the heating chamber to another specified temperature is executed further than a supply flow rate of the gas when setting changing of the temperature of the heating chamber is not executed.

According to a fourth aspect of the present invention, there is provided a heating apparatus comprising:

a conveyance section for conveying a bonding base object to which an electronic component is bonded via an object to be heated;

a heating chamber for heating the object to be heated on the bonding base object by supplying at a specified flow rate heated gas heated to a specified temperature by a heating device as a heating source onto the bonding base object conveyed by the conveyance section; and a gas flow rate control unit for controlling the gas supply flow rate so as to increase a supply flow rate of the gas when setting changing of a temperature of the heating chamber to another specified temperature is executed further than a supply flow rate of the gas when setting changing of the temperature of the heating chamber is not executed.

According to a fifth aspect of the present invention, there is provided a heating apparatus as defined in any one of the 1st through 4th aspects, wherein further comprising a bonding base object detecting unit for detecting passing of the bonding base object through heating apparatus entrance and exit to detect presence or absence of the bonding base object inside the heating apparatus by the bonding base object detecting unit, the gas supply heat quantity control unit executes control so as to determine that heat treatment for the object to be heated is needed upon detecting the presence of the bonding base object inside the heating apparatus to supply a quantity of supply heat for heat treatment use as a quantity of supply heat of the gas and determine that no heat treatment for the object to be heated is needed upon detecting the absence of the bonding base object inside the heating apparatus to supply a quantity of standby supply heat smaller than the quantity of supply heat for heat treatment use as the quantity of supply heat of the gas.

According to a sixth aspect of the present invention, there is provided A heating apparatus as defined in the 5th aspect, wherein the gas supply heat quantity control unit comprises a gas supply flow rate control section, which executes control so as to determine that heat treatment for the object to be heated is needed upon detecting the presence of the bonding base object inside the heating apparatus to supply a quantity of supply heat for heat treatment use as a quantity of supply heat of the gas and determine that no heat treatment for the object to be heated is needed upon detecting the absence of the bonding base object inside the heating apparatus to supply a quantity of standby supply heat smaller than the quantity of supply heat for heat treatment use as the quantity of supply heat of the gas.

According to a seventh aspect of the present invention, there is provided a heating apparatus as defined in the 5th aspect, wherein the gas supply heat quantity control unit comprises a gas temperature control section, which executes control so as to determine that heat treatment for the object to be heated is needed upon detecting the presence of the bonding base object inside the heating apparatus to heat the heated gas to a temperature for heat treatment use as a quantity of supply heat of the gas and determine that no heat treatment for the object to be heated is needed upon detecting the absence of the bonding base object inside the heating apparatus to lower the temperature of the heated gas to a standby temperature lower than the temperature for heat treatment use as the quantity of supply heat of the gas.

According to an eighth aspect of the present invention, there is provided a heating method comprising:
supplying at a specified flow rate heated gas heated to a specified temperature as a heating source onto a bonding base object, which is conveyed by a conveyance section and to which an electronic component is bonded via an object to be heated, inside a heating chamber so as to heat the object to be heated on the bonding base object, and
controlling a quantity of supply heat of the gas so that a supply heat quantity of the gas when no heat treatment for the object to be heated is needed is made smaller than a supply heat quantity of the gas when heat treatment for the object to be heated is needed.

According to a ninth aspect of the present invention, there is provided a heating method as defined in the 8th aspect, wherein, in executing the gas supply heat quantity control, the quantity of supply heat of the gas when no heat treatment for the object to be heated is needed is made smaller than the quantity of supply heat of the gas when heat treatment for the object to be heated is needed, and the quantity of supply heat of the gas is controlled so as to increase the supply heat quantity of the gas when setting changing of a temperature of the heating chamber to another specified temperature is executed further than the supply heat quantity of the gas when setting changing of the temperature of the heating chamber is not executed.

According to a tenth aspect of the present invention, there is provided a heating method as defined in the 8th aspect, wherein, in executing the gas supply heat quantity control, the quantity of supply heat of the gas when no heat treatment for the object to be heated is needed is made smaller than the quantity of supply heat of the gas when heat treatment for the object to be heated is needed, and the quantity of supply heat of the gas is controlled so as to increase the a supply flow rate of the gas when setting changing of a temperature of the heating chamber to another specified temperature is executed further than a supply flow rate of the gas when setting changing of the temperature of the heating chamber is not executed.

According to an 11th aspect of the present invention, there is provided a heating method comprising:
supplying at a specified flow rate heated gas heated to a specified temperature as a heating source onto a bonding base object, which is conveyed by a conveyance section and to which an electronic component is bonded via an object to be heated, inside a heating chamber so as to heat the object to be heated on the bonding base object, and
controlling a quantity of supply heat of the gas so as to increase a supply flow rate of the gas when setting changing of a temperature of the heating chamber to another specified temperature is executed further than a supply flow rate of the gas when setting changing of the temperature of the heating chamber is not executed.

According to a 12th aspect of the present invention, there is provided a heating method as defined in any one of the 8th through 11th aspects, wherein
whether or not the bonding base object has passed through an entrance and an exit of a heating apparatus including the heating chamber is detected, and
in controlling the gas supply heat quantity, the control is executed so as to determine that heat treatment for the object to be heated is needed upon detecting presence of the bonding base object within the heating method to supply a quantity of supply heat for heat treatment use as a quantity of supply heat of the gas and determine that no heat treatment for the object to be heated is needed upon detecting absence of the bonding base object within the heating method to supply a quantity of standby supply heat smaller than the quantity of supply heat for heat treatment use as the quantity of supply heat of the gas.

According to a 13th aspect of the present invention, there is provided a heating method as defined in the 12th aspect, comprising a gas supply flow rate control section, which executes control, when the gas supply heat quantity is executed, so as to determine that heat treatment for the object to be heated is needed upon detecting the presence of the bonding base object within the heating method to supply a quantity of supply heat for heat treatment use as a quantity of supply heat of the gas and determine that no heat treatment for the object to be heated is needed upon detecting the absence of the bonding base object within the heating method to supply a quantity of standby supply heat smaller than the quantity of supply heat for heat treatment use as the quantity of supply heat of the gas.

According to a 14th aspect of the present invention, there is provided A heating method as defined in the 12th aspect, comprising a gas temperature control section, which executes control, when the gas supply heat quantity control is executed, so as to determine that heat treatment for the object to be heated is needed upon detecting the presence of the bonding base object within the heating method to heat the heated gas to a temperature for heat treatment use as a quantity of supply heat of the gas and determine that no heat treatment for the object to be heated is needed upon detecting the absence of the bonding base object within the heating method to lower the temperature of the heated gas to a standby temperature lower than the temperature for heat treatment use as the quantity of supply heat of the gas.

According to a 15th aspect of the present invention, there is provided a heating apparatus as defined in any one of the 1st through 7th aspects, wherein the conveyance section has a pair of rail sections to convey the bonding base object, and at least either one of the pair of rail sections of the conveyance section is further provided with a heated gas flow path control member for changing to an inside of the heating chamber a flow path of the heated gas that tries to advance from the heating chamber toward an outside of the heating chamber at a boundary between the heating chamber and the outside of the heating chamber.

According to a 16th aspect of the present invention, there is provided a heating apparatus comprising:

a conveyance section, having a pair of rail sections, for conveying a bonding base object to which an electronic component is bonded via an object to be heated;

a heating chamber for heating the object to be heated on the bonding base object conveyed by the conveyance section by supplying heated gas heated to a specified temperature; and a heated gas flow path control member for changing to an inside of the heating chamber a flow path of the heated gas that tries to advance from the heating chamber toward the outside of the heating chamber at a boundary between the heating chamber and an outside of the heating chamber, the heated gas flow path control member being located at least either one of the pair of rail sections of the conveyance section.

According to a 17th aspect of the present invention, there is provided a heating apparatus as defined in the 15th or 16th aspect, wherein the heated gas flow path control member is a shield plate, arranged just above at least either one of the pair of rail sections of the conveyance section and at the boundary between the heating chamber and the outside of the heating chamber, for blocking the flow path of the heated gas that tries to advance from the heating chamber toward the outside of the heating chamber.

According to an 18th aspect of the present invention, there is provided a heating apparatus as defined in the 15th or 16th aspect, wherein the heated gas flow path control member is a shield plate, which has a curved convex surface curved toward the outside of the heating chamber in a direction in which the bonding base object is conveyed and changes to the inside of the heating chamber the flow path of the heated gas that tries to advance from the heating chamber toward the outside of the heating chamber along the curved surface of the shield plate.

According to a 19th aspect of the present invention, there is provided a heating apparatus as defined in the 15th or 16th aspect, wherein at least either one rail section of the pair of rail sections of the conveyance section is fixed, the other rail section is a movable rail section arranged movably in a direction in which the movable rail section moves close to or apart from the fixed rail section according to a width dimension of the bonding base object, and the heated gas flow path control member is connected to the movable rail section so as to be integrally moved and comprised of a shield plate for closing a region that belongs to the heating chamber and has no relation to board conveyance in an opening for conveying the bonding base object.

According to a 20th aspect of the present invention, there is provided a heating apparatus as defined in any one of the 15th through 19th aspects, wherein the heated gas flow path control member has a heat insulator for restraining heat conduction from the heated gas toward the outside of the heating chamber.

According to a 21st aspect of the present invention, there is provided a heating apparatus as defined is in any one of the 15th through 20th aspects, wherein the heated gas flow path control member is comprised of at least either one rail section of the pair of rail sections of the conveyance section whose upper portion has a mountain-like cross-section shape, and makes the heated gas flow downward from above along the mountain-like cross section shape of the upper portion of the one rail section, blocking the heated gas from flowing toward the outside of the heating chamber along an upper surface of the rail section.

According to a 22nd aspect of the present invention, there is provided a heating apparatus as defined in any one of the 15th through 20th aspects, wherein the heated gas flow path control member is comprised of at least either one rail section of the pair of rail sections of the conveyance section whose upper surface is sloped so as to be lowered toward an opposite side of the bonding base object conveyed by the rail sections of the conveyance section.

According to a 23rd aspect of the present invention, there is provided a heating apparatus as defined in the 15th or 16th aspect, wherein the heated gas flow path control member is constructed so as to change to the inside of the heating chamber the flow path of the heated gas that tries to advance from the heating chamber toward the outside of the heating chamber by a partition wall arranged at the boundary between the heating chamber and the outside of the heating chamber in at least either one of the pair of rail sections of the conveyance section.

According to a 24th aspect of the present invention, there is provided a heating apparatus as defined in any one of the 1st through 7th aspects and the 15th through 23rd aspects, wherein the object to be heated on the bonding base object is a bonding material for bonding the electronic component to the bonding base object.

According to a 25th aspect of the present invention, there is provided a heating apparatus as defined in any one of the 1st through 7th aspects and the 15th through 23rd aspects, wherein the object to be heated on the bonding base object is a solder or an electronic component fixing-thermosetting adhesive for bonding the electronic component to the bonding base object or an electronic component encapsulation resin for encapsulating the electronic component.

According to a 26th aspect of the present invention, there is provided a heating method as defined in any one of the 11th through 14th aspects, wherein the flow path of the heated gas that tries to advance from the heating chamber toward the outside of the heating chamber is controlled so as to change to the inside of the heating chamber at a boundary between the heating chamber for heating the object to be heated on the bonding base object conveyed by the conveyance section that has a pair of rail sections by supplying the heated gas heated to the specified temperature and the outside of the heating chamber in at least either one of the pair of rail sections of the conveyance section.

According to a 27th aspect of the present invention, there is provided a heating method for executing control so that a flow path of heated gas that tries to advance from a heating chamber toward an outside of the heating chamber is controlled so as to be changed to an inside of the heating chamber at a boundary between the heating chamber and the outside of the heating chamber for heating the object to be heated on the bonding base object which is conveyed by a conveyance section having a pair of rail sections and to which an electronic component is bonded via the object to be heated by supplying the heated gas heated to the specified temperature in at least either one of the pair of rail sections of the conveyance section.

According to a 28th aspect of the present invention, there is provided a heating method as defined in the 26th or 27th aspect, wherein the flow path of the heated gas that tries to advance from the heating chamber toward the outside of the heating chamber is blocked by a shield plate, which is arranged just above at least either one of the pair of rail sections of the conveyance section and at the boundary between the heating chamber and the outside of the heating chamber in controlling the heated gas flow path.

According to a 29th aspect of the present invention, there is provided a heating method as defined in the 26th or 27th aspect, wherein the flow path of the heated gas that tries to advance from the heating chamber toward the outside of the heating chamber is changed to the inside of the heating chamber by a shield plate, which has a curved convex surface curved toward the outside of the heating chamber in a direction in which the bonding base object is conveyed, along the curved surface of the shield plate in controlling the heated gas flow path.

According to a 30th aspect of the present invention, there is provided a heating method as defined in the 26th or 27th aspect, wherein at least either one rail section of the pair of rail sections of the conveyance section is fixed, the other rail section is a movable rail section arranged movably in a direction in which the movable rail section moves close to or apart from the fixed rail section according to a width dimension of the bonding base object, and a region that belongs to the heating chamber and has no relation to board conveyance in an opening for conveying the bonding base object is closed by a shield plate connected to the movable rail section so as to be integrally moved in controlling the heated gas flow path.

According to a 31st aspect of the present invention, there is provided a heating method as defined in any one of the 28th through 30th aspects, wherein heat conduction from the heated gas toward the outside of the heating chamber is restrained by a heat insulator of the shield plate in changing to the inside of the heating chamber the flow path of the heated gas that tries to advance from the heating chamber toward the outside of the heating chamber in controlling the heated gas flow path.

According to a 32nd aspect of the present invention, there is provided a heating method as defined in any one of the 26th through 31st aspects, wherein the heated gas flows downward from above along the mountain-like cross-section shape of the upper portion of at least either one rail section of the pair of rail sections of the conveyance section in controlling the heated gas flow path, thus blocking the heated gas from flowing toward the outside of the heating chamber along the rail section upper surface.

According to a 33rd aspect of the present invention, there is provided a heating method as defined in any one of the 26th through 31st aspects, wherein at least either one rail section of the pair of rail sections of the conveyance section has an upper surface sloped so as to be lowered toward an opposite side of the bonding base object conveyed by the rail sections of the conveyance section, and the heated gas flows downward from above along the slope of the upper surface of the one rail section in controlling the heated gas flow path, thus blocking the heated gas from flowing toward the outside of the heating chamber along the upper surface of the one rail section.

According to a 34th aspect of the present the electronic component to the bonding base object or an electronic component encapsulation resin for encapsulating the electronic component.

According to a 37th aspect of the present invention, there is provided a heating apparatus as defined in any one of the 15th, 16th, and 18th through 25th aspects, wherein the heating chamber comprises a preparatory chamber for preliminarily heating the bonding base object before heat treatment and a heating use heating chamber to subject the bonding base object heated preliminarily to heat treatment, and the heated gas flow path control member is respectively provided at an entrance of the preparatory chamber and an exit of the heating use heating chamber.

BRIEF DESCRIPTION OF DRAWINGS

These and other aspects and features of the present invention will become clear from the following description taken in conjunction with the preferred embodiments thereof with reference to the accompanying drawings, in which.

BEST MODE FOR CARRYING OUT THE INVENTION

Figure 1:
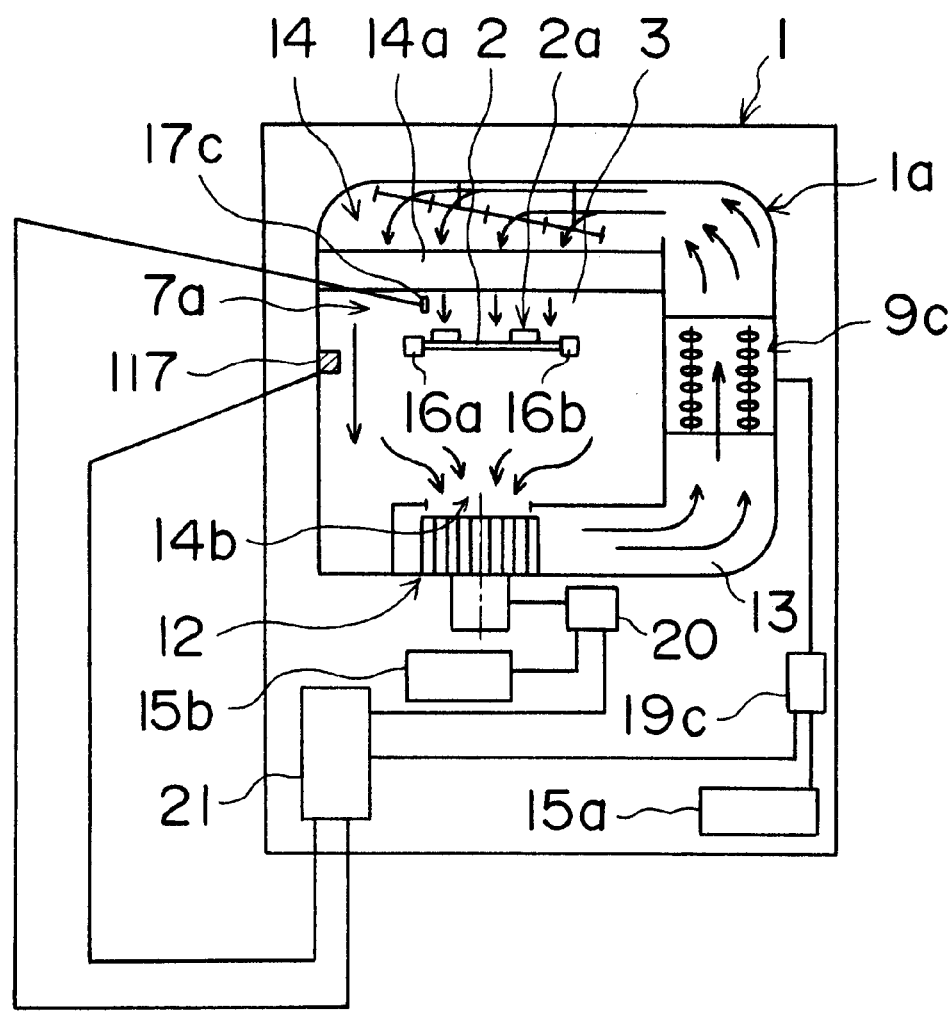
FIG. 1 is a side view of a reflow apparatus according to first, second, and third embodiments of the present invention.

Before the description of the present invention proceeds, it is to be noted that like parts are designated by like reference numerals throughout the accompanying drawings.

A first embodiment of the present invention will be described in detail below with reference to the drawings.

First Embodiment

FIG. 1 shows a side view of a reflow apparatus for embodying a reflow apparatus and method as an example of a heating apparatus and method according to the first embodiment of the present invention.

As shown in FIG. 1, in the reflow apparatus' having a conveyance section 3 that conveys a bonding base object (object to be bonded) on which electronic components 2a are mounted, four heating chambers 6a, 6b, 7a, and 7b that include this conveyance section 3, provides a specified temperature by supplying (in other words, supplying with circulation or supplying without circulation) heated gas via a heating device (for example, heaters 9a, 9b, 9c, and 9d), supplies at a specified flow rate the heated gas of a specified temperature as a heating source onto the bonding base object, and heats and melts the object to be heated such as solder on the bonding base object, a cooling chamber 9 that is located adjacent to the heating chambers rearwardly in a direction in which the bonding base object is conveyed and cools and solidifies the melted solder, and circuit board passing monitor sensors 18a and 18b, which serve as an example of a board detecting unit for detecting the fact that the bonding base object has passed through apparatus entrance 4 and exit 5, there is provided flow rate control units 14 and 21 for controlling the supply quantity of the gas until the heating chamber comes to have a specified temperature. This apparatus will be described in concrete below with reference to the drawings.

The reflow apparatus of the first embodiment employs heated air as an example of the heated gas and employs a circuit board as one example of the bonding base object on which components are mounted. However, the present invention is not limited to this and allowed to employ an inert gas such as nitrogen gas as another example of the heated gas. Furthermore, a component on which an electronic component can be mounted can be employed as another example of the bonding base object. In the reflow apparatus of the first embodiment, the object to be heated is provided as an example by solder paste as an example of the bonding material for bonding the electronic component 2a on the circuit board 2. However, the present invention is not limited to this and allowed to be an electronic component fixing use thermosetting adhesive or a conductive adhesive or an encapsulation resin of an electronic component (IC chip, for example). In the reflow apparatus of the first embodiment, the heating chamber is provided as an example by the four heating chambers, i.e., the first preheating chamber 6a, the second preheating chamber 6b, the first reflow heating chamber 7a, and the second reflow heating chamber 7b. However, the present invention is not limited to this and allowed to be provided by one reflow heating chamber or one preparatory chamber and one reflow heating chamber. As an example of the heating apparatus, the reflow apparatus for heating and melting the reflow-use solder on the bonding base object is provided as an example. However, the present invention is not limited to this and also allowed to be applied to a thermosetting apparatus for hardening an electronic component fixing use thermosetting adhesive or a conductive adhesive or an encapsulation resin of an electronic component (IC chip, for example).

Figure 2:
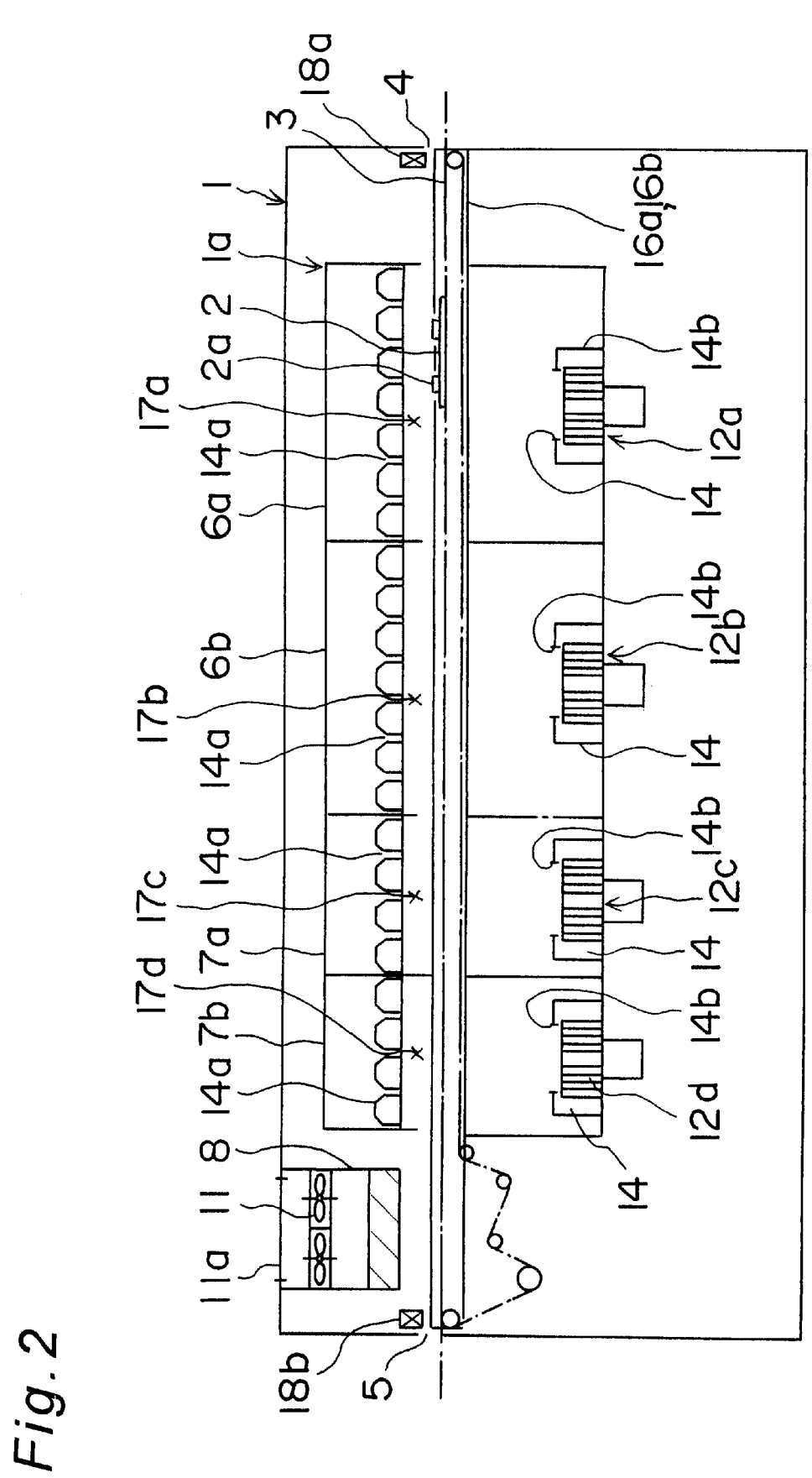
FIG. 2 is a front view of the reflow apparatus of FIG. 1.

FIG. 2 shows a front view of the reflow apparatus of the first embodiment of the present invention.

Figure 3:
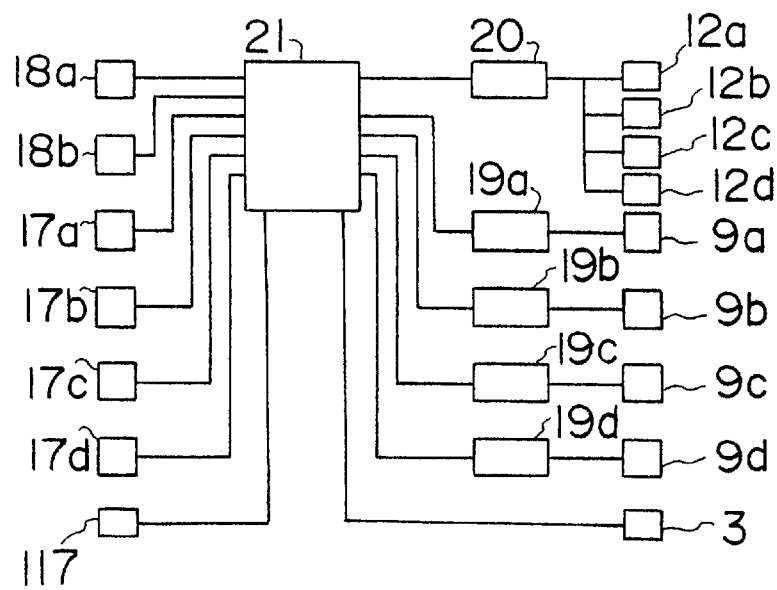
FIG. 3 is a block diagram showing the construction of a control system of the reflow apparatus of FIG. 1.

FIG. 3 is a block diagram showing the construction of a control system of the reflow apparatus of the first embodiment of the present invention.

Figure 4:
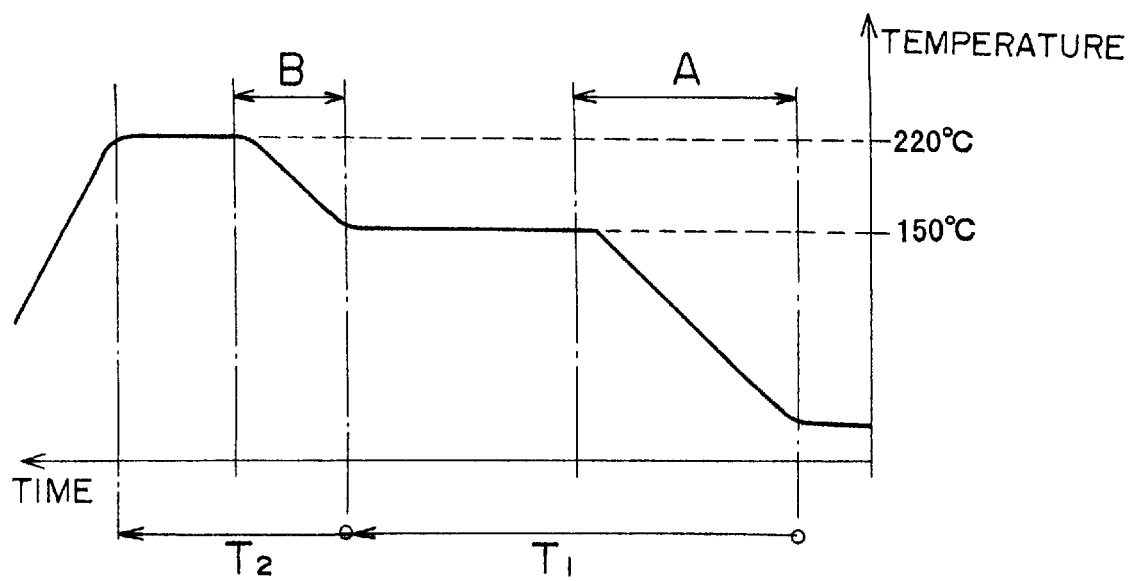
FIG. 4 is a graph showing the temperature profile of the reflow apparatus of FIG. 1.

FIG. 4 is a graph showing the temperature profile of the reflow apparatus of the first embodiment of the present invention. This temperature profile can be varied depending on the type and material of the board, the type and the number of components mounted on the board and so on. For example, the high temperature t2 can be set lower for a small board by comparison with a large board. Basically, although one temperature profile can be applied to a board of one type, one temperature profile can be applied to boards of a plurality of types.

Figure 5:
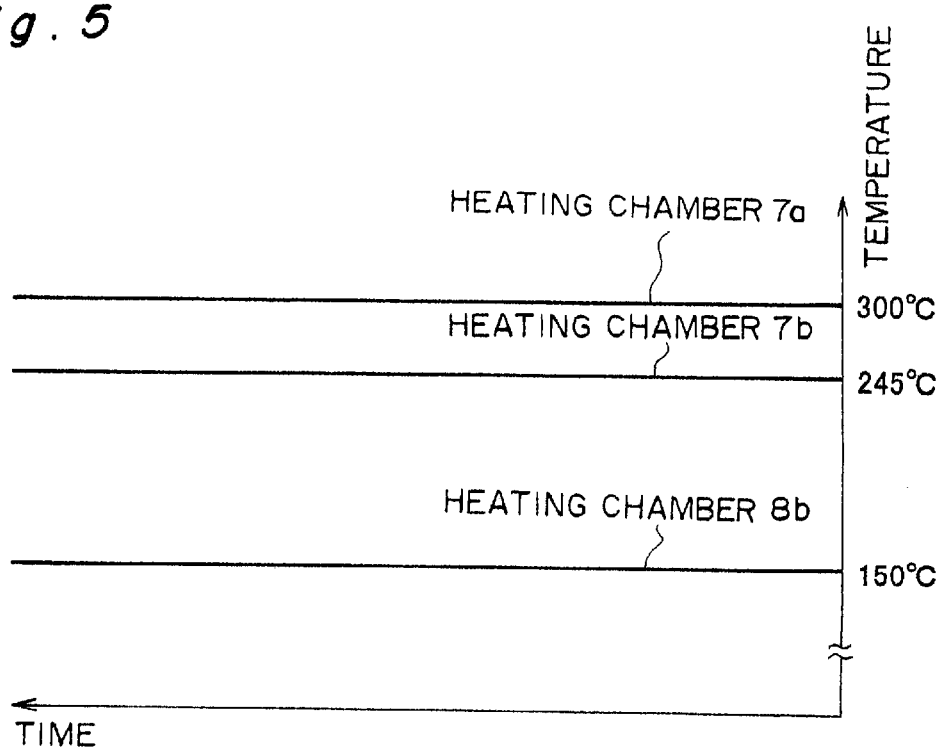
FIG. 5 is a graph showing the heated air temperatures of the chambers of the reflow apparatus of FIG. 1.

FIG. 5 is a graph showing an example of the heated air temperatures of the heated gas in the respective chambers of the reflow apparatus of the first embodiment of the present invention.

Figure 6:
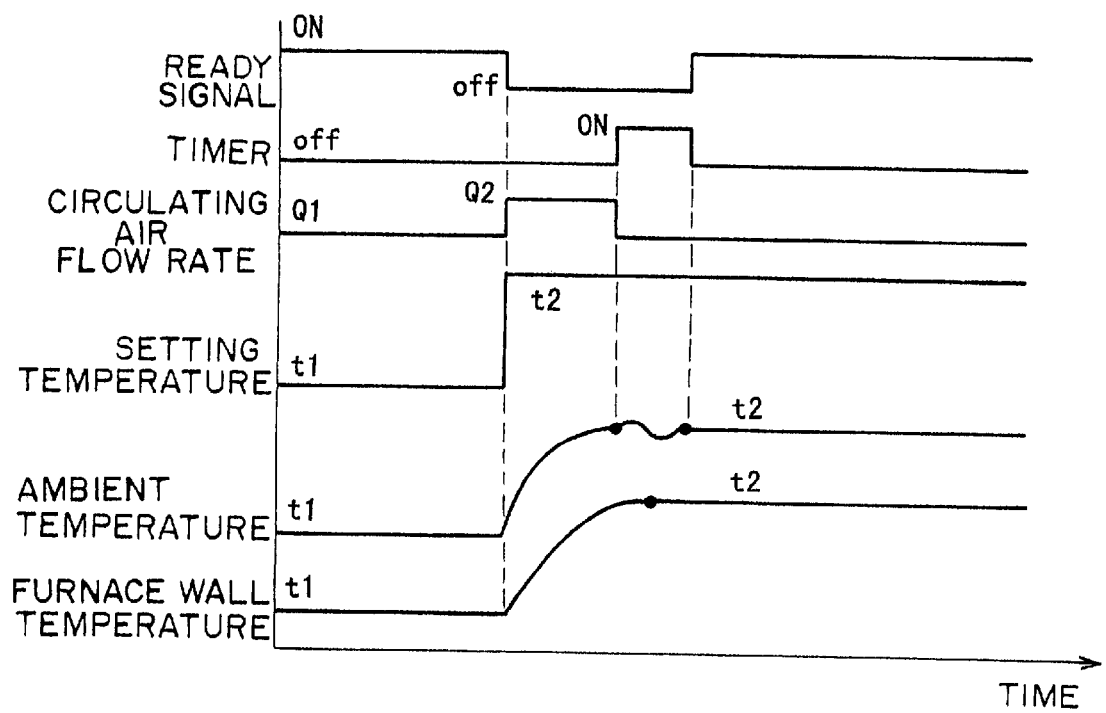
FIG. 6 is an operation timing chart of the reflow apparatus of the first embodiment of the present invention.

FIG. 6 is an operation timing chart of the reflow apparatus of the first embodiment of the present invention when the temperature rises.

Figure 7:
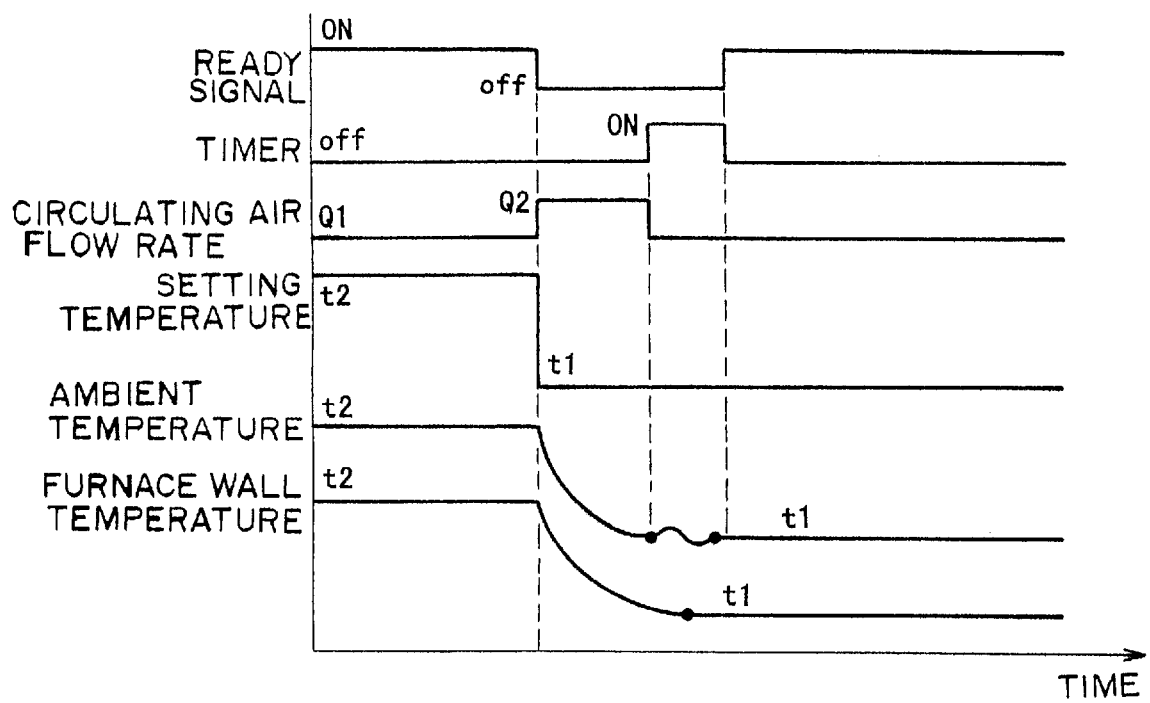
FIG. 7 is an operation timing chart of the reflow apparatus of the first embodiment of the present invention.

FIG. 7 is an operation timing chart of the reflow apparatus of the first embodiment of the present invention when the temperature falls.

As shown in FIG. 2, the reflow apparatus has a conveyance section 3 such as a chain conveyor for conveying a circuit board 2 from an entrance 4 to the exit 5 of the reflow apparatus 1 and a first preheating chamber 6a, a second preheating chamber 6b, a first reflow heating chamber 7a, a second reflow heating chamber 7b, and a cooling chamber 8, which are arranged from the entrance 4 side to the exit 5 side and constitute a furnace section 1a. As shown in FIG. 1 through FIG. 3, the first and second preheating chambers 6a and 6b and the first and second reflow heating chambers 7a and 7b have sirocco fans 12a, 12b, 12c, and 12d for circulating air, and hot blast circulating units 14 provided with heaters 9a, 9b, 9c, and 9d for heating the circulating air 13. One example of a gas supply heat quantity control unit is constructed of this hot blast circulating units 14 and a controller 21. These four sirocco fans 12a, 12b, 12c, and 12d are supplied with electric power from a power supply source 15b via one or more inverters 20 for revolution number control. It is to be noted that setting of the inverter 20 is controlled by the controller 21, and an example of a gas supply flow rate control section is constructed of the inverter 20 and the controller 21. The heaters 9a, 9b, 9c, and 9d are supplied with electric power from a power supply source 15a via thermoregulators 19a, 19b, 19c, and 19d, which are arranged above the conveyance section 3 and in the first preheating chamber 6a, the second preheating chamber 6b, the first reflow heating chamber 7a, and the second reflow heating chamber 7b and controlled by the controller 21. An example of the gas temperature control section is constructed of the controller 21 and the thermoregulators 19a, 19b, 19c, and 19d. It is to be noted that temperature management sensors 17a, 17b, 17c, and 17d connected to the controller 21 are arranged above the conveyance section 3 and in the first preheating chamber 6a, the second preheating chamber 6b, the first reflow heating chamber 7a, and the second reflow heating chamber 7b, and the heating chamber and preheating chamber atmospheric temperatures are controlled by the controller 21.

A hot blast outlet port 14a of this hot blast circulating unit 14 is located above the conveyance section 3 and blows heated air against the upper surface of the circuit board 2. On the other hand, a hot blast inlet port 14b of the hot blast circulating unit 14 is located below the conveyance section 3 and takes in the heated air.

The cooling chamber 8 is constructed of a fresh air intake port 11a and a cooling use axial flow fan 11.

Further, passing monitor sensors 18a and 18b of the circuit board 2 are placed at the reflow apparatus entrance 4 and the exit 5, respectively. The passing monitor sensors 18a and 18b are each connected to the controller 21, and passing signals output from the passing monitor sensors 18a and 18b are inputted to the controller 21.

Next, when subjecting the circuit board 2 to a reflow process in the reflow apparatus 1, the circuit board 2 on the upper surface of which the components 2a are mounted on the solder paste is conveyed from the entrance 4 to the exit 5 by the conveyance section 3.

In this case, when the circuit board 2 passes sequentially through the first preheating chamber 6a, the second preheating chamber 6b, the first reflow heating chamber 7a, and the second reflow heating chamber 7b, as shown in FIG. 4 and FIG. 5, the solder is preliminarily heated to a temperature of about 150° C. in a preheating interval T1 inside the first and second preheating chambers 6a and 6b. The board is heated to a temperature of about 220° C. in a reflow heating interval T2 inside the first and second reflow heating chambers 7a and 7b so as to heat the solder to a melting temperature for melting, and the melted solder is cooled and solidified by the cooling of the cooling chamber 8. In the above stage, the temperatures of the heaters 9a and 9b of the first and second preheating chambers 6a and 6b, the flow rates of the sirocco fans 12a and 12b, the temperatures of the heaters 9c and 9d of the first and second reflow heating chambers 7a and 7b, and the flow rates of the sirocco fans 12c and 12d are set by the controller 21 to the respective temperatures and flow rates corresponding to the thermal capacity of the circuit board 2 to be subjected to the reflow process. That is, the temperature of the heated air in each chamber, i.e., the atmospheric temperature in each chamber is controlled to a temperature corresponding to the thermal capacity of the circuit board 2 as shown in FIG. 6 in reflow apparatus starting and preparing processes. According to the present first embodiment, as shown in FIG. 3, the sensors 17a, 17b, 17c, and 17d of the preheating chambers 6a and 6b and the first and second reflow heating chambers 7a and 7b are connected to the controller 21. By controlling the respective heaters 9a, 9b, 9c, and 9d via a thermoregulator 20 with the controller 21, the heated air temperature of each chamber is controlled.

In the reflow apparatus of the first embodiment, the consumption power can be reduced by setting the temperature of each chamber lower than a specified heat treatment temperature and maintaining the temperature when the circuit board 2 is not subjected to the reflow process. Therefore, subjecting the circuit board 2 to the reflow process is accompanied by temperature setting changing of the first and second preheating chambers 6a and 6b and the first and second reflow heating chambers 7a and 7b. Therefore, as shown in FIG. 6, when changing the atmospheric temperatures of the first and second preheating chambers 6a and 6b and the first and second reflow heating chambers 7a and 7b from the low temperature t1 to the high temperature t2 by switching the READY signal that is the loading enable signal from ON (circuit board loading enable state) to OFF (circuit board loading disable state), the controller 21 switches the flow rates of the sirocco fans 12a, 12b, 12c, and 12d from a specified flow rate Q1 for reflow process to a specified flow rate Q2 (note that Q2>Q1) for setting changing by the inverter 20 to increase the amounts of circulating air that respectively pass through the heaters 9a, 9b, 9c, and 9d, thereby increasing the quantities of heat to be supplied to the preheating chambers 6a and 6b and the first and second reflow heating chambers 7a and 7b. This can reduce the time during which the atmospheric temperatures of the preheating chambers 6a and 6b and the first and second reflow heating chambers 7a and 7b reach the specified setting changing temperature of the high temperature t2 from the low temperature t1. Furthermore, by increasing the quantity of supply heat, the rise in the furnace wall temperature of the inner walls constituting the preheating chambers 6a and 6b and the first and second reflow heating chambers 7a and 7b is also accelerated, and this can reduce the time during which the furnace wall temperatures of the inner walls of the preheating chambers 6a and 6b and the first and second reflow heating chambers 7a and 7b reach the thermal equilibrium state at the high temperature t2 from the low temperature t1.

It is to be noted that the low temperature t1 and the high temperature t2 mean neither same low temperature t1 and same high temperature t2 in all the chambers of the first and second preheating chambers 6a and 6b and the first and second reflow heating chambers 7a and 7b nor same low temperature t1 and same high temperature t2 of the atmospheric temperature and the furnace wall temperature in each chamber. The temperatures t1 and t2 mean respective low temperatures t1 and high temperatures t2 of the chambers and respective low temperatures t1 and high temperatures t2 of the atmospheric temperature and the furnace wall temperature in each chamber. The first and second preheating chambers 6a and 6b and the first and second reflow heating chambers 7a and 7b may have utterly different low temperatures t1. The preheating chambers and the reflow heating chambers may have respective same low temperatures t1. The first and second preheating chambers 6a and 6b and the first and second reflow heating chambers 7a and 7b may have utterly different high temperatures t2. The preheating chambers and the reflow heating chambers may have respective same high temperature t2. The flow rate Q1 and the flow rate Q2 do not mean same flow rate Q1 and same flow rate Q2 in all the chambers of the first and second preheating chambers 6a and 6b and the first and second reflow heating chambers 7a and 7b but mean respective flow rates Q1 and flow rates Q2 in the chambers. The first and second preheating chambers 6a and 6b and the first and second reflow heating chambers 7a and 7b may have utterly different flow rates Q1. The preheating chambers and the reflow heating chambers may have respective same flow rates Q1. The first and second preheating chambers 6a and 6b and the first and second reflow heating chambers 7a and 7b may have utterly different flow rates Q2. The preheating chambers and the reflow heating chambers may have respective same flow rates Q2.

With the above-mentioned arrangement, when the temperature management sensors 17a, 17b, 17c, and 17d detect that the atmospheric temperatures of the preheating chambers 6a and 6b and the first and second reflow heating chambers 7a and 7b have reached the high temperature t2 of the specified temperature, the respective flow rates of the sirocco fans 12a, 12b, 12c, and 12d are switched from the setting changing-use specified flow rate Q2 to the reflow process-use specified flow rate Q1 under the control of the controller 21, thus stabilizing the flow of the circulating air. Therefore, a timer provided inside the controller 20 counts an arbitrary time (one to two minutes, for example) for the stabilization of the furnace wall temperatures of the preheating chambers 6a and 6b and the first and second reflow heating chambers 7a and 7b at the high temperature t2 of the specified temperature, and thereafter, the is controller 21 outputs a reflow process enable signal to the conveyance section 3 or the unit located on the upstream side (i.e., the READY signal that is the loading enable signal is turned ON). It is to be noted that the reflow process flow specified rate Q1 is set to a flow rate at which the flow of the circulating air is stabilized and the reflow process is smoothly executed.

Conversely, when changing the setting of the atmospheric temperatures of the first and second preheating chambers 6a and 6b and the first and second reflow heating chambers 7a and 7b from the high temperature t2 to the low temperature t1 by switching the READY signal that is the loading enable signal from ON ((circuit board loading enable state) to OFF (circuit board loading disable state) as shown in FIG. 7 in changing the type of the circuit board to be subjected to heat treatment or in a similar case, the controller 21 switches the respective flow rates of the sirocco fans 12a, 12b, 12c, and 12d from the reflow process-use specified flow rate Q1 to the setting changing-use specified flow rate Q2 (note that Q2>Q1) by the inverter 20 to increase the amounts of circulating air passing through the heaters 9a, 9b, 9c, and 9d, thereby accelerating the cooling by the circulating air in the preheating chambers 6a and 6b and the first and second reflow heating chambers 7a and 7b. This can reduce the time required for the atmospheric temperatures of the preheating chambers 6a and 6b and the first and second reflow heating chambers 7a and 7b to reach the low temperature t1 of the specified setting changing temperature from the high temperature t2. Furthermore, by accelerating the cooling of the circulating air, the fall of the furnace wall temperatures of the respective inner wall surfaces constituting the preheating chambers 6a and 6b and the first and second reflow heating chambers 7a and 7b is also accelerated, and the time when the furnace wall temperatures of the respective inner wall surfaces of the preheating chambers 6a and 6b and the first and second reflow heating chambers 7a and 7b reach the thermal equilibrium state at the low temperature t2 from the high temperature t2 can be shortened.

When the respective temperature management sensors 17a, 17b, 17c, and 17d detect that the respective atmospheric temperatures of the preheating chambers 6a and 6b and the first and second reflow heating chambers 7a and 7b have reached the low temperature t1 of the specified temperature, the respective flow rates of the sirocco fans 12a, 12b, 12c, and 12d are switched from the setting changing-use specified flow rate Q2 to the reflow process-use specified flow rate Q1 under the control of the controller 21, stabilizing the flow of the circulating air. Therefore, a timer provided inside the controller 21 counts an arbitrary time (one to two minutes, for example) for the stabilization of the furnace wall temperatures of the preheating chambers 6a and 6b and the first and second reflow heating chambers 7a and 7b at the low temperature t1 of the specified temperature, and thereafter, the controller 21 outputs a reflow process enable signal to the conveyance section 3 or the unit located on the upstream side (i.e., the READY signal that is the loading enable signal is turned ON).

It is to be noted that the setting changing-use specified flow rate Q2 may be varied without being limited to same flow rate when raising each atmospheric temperature from the low temperature to the high temperature and when conversely lowering the temperature from the low temperature to the high temperature.

According to the above-mentioned construction, the quantities of supply heat can be controlled by controlling the flow rates of the heated air so as to increase the amounts of circulating air passing through the heaters 9a, 9b, 9c, and 9d by the switching of the respective flow rates of the sirocco fans 12a, 12b, 12c, and 12d to the setting changing-use specified flow rate Q2 greater than the reflow process-use specified flow rate Q1 by the inverter 20 under the controller 21 when changing the setting of the atmospheric temperatures of the first and second preheating chambers 6a and 6b and the first and second reflow heating chambers 7a and 7b, and the time required for each heating chamber to reach the specified temperature can be concurrently reduced, improving the productivity. Furthermore, the time required for the changing of the temperature setting of the preheating chambers 6a and 6b and the first and second reflow heating chambers 7a and 7b is reduced, for which a reflow apparatus of a reduced consumption power can be provided. As an example, the time required for each heating chamber to reach the specified temperature can be reduced to about five minutes to 10 minutes in the present embodiment in contrast to the fact that about 30 minutes to 45 minutes have conventionally been required.

Since the atmospheric temperatures of the chambers can be changed and set within a short time as described above, by making the quantity of supply heat of the gas when no reflow process is needed for the circuit board 2 smaller than the quantity of supply heat of the gas when the reflow process of the circuit board 2 is needed so as to increase the quantity of supply heat of the gas when the reflow process of the circuit board 2 is needed, the required quantity of supply heat of the gas can be secured in a short time without largely impairing the productivity. Therefore, the quantity of supply heat of the gas when the reflow process of the circuit board 2 is not needed or in a standby stage can be reduced, allowing the consumption power to be reduced.

Second Embodiment

Figure 8:
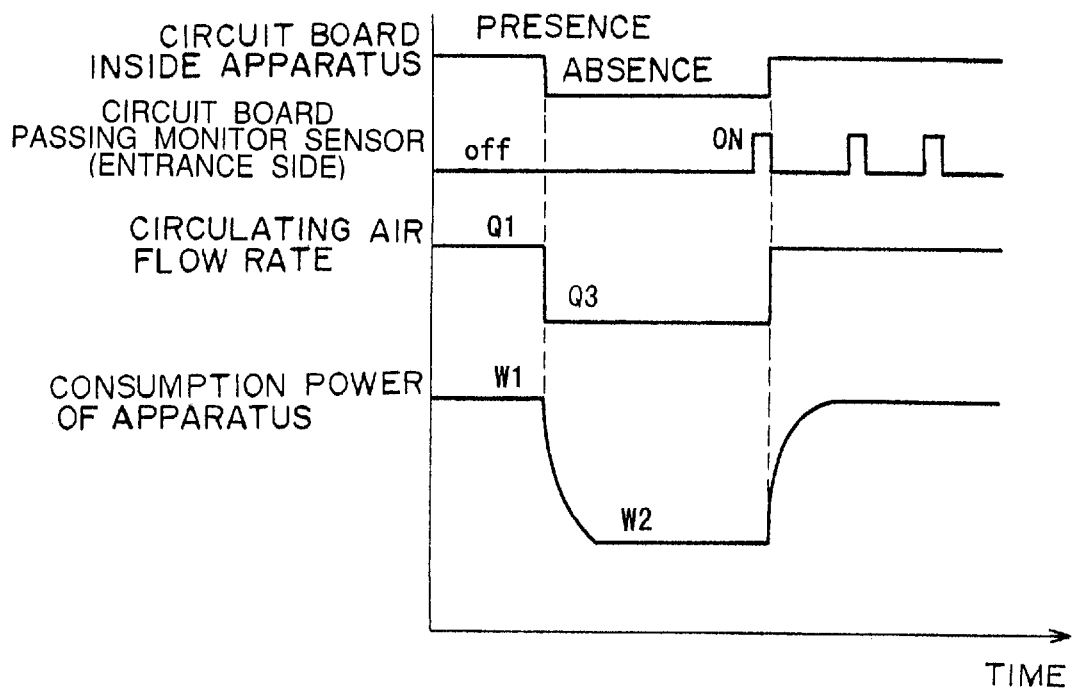
FIG. 8 is an operation timing chart of the reflow apparatus of the second embodiment of the present invention.

FIG. 8 shows an operation timing chart of a reflow apparatus and method according to a second embodiment of the present invention.

As shown in FIG. 3, the present second embodiment is to input to the controller 20 signals detected by circuit board passing monitor sensors 18a and 18b (see FIG. 2) located at the entrance 4 and the exit 5 of the reflow apparatus 1 of the first embodiment, detect the presence or absence of a circuit board 2 in the reflow apparatus and change the flow rates of the sirocco fans 12a, 12b, 12c, and 12d.

As shown in FIG. 8, when no circuit board 2 exists inside the reflow apparatus 1, the controller 21 switches the flow rates of the sirocco fans 12a, 12b, 12c, and 12d from the reflow process-use specified flow rate Q1 to a standby flow rate Q3 (note that Q3<Q1) to reduce the amounts of circulating air passing through the heaters 9a, 9b, 9c, and 9d, thereby reducing the quantities of heat to be supplied to the preheating chambers 6a and 6b and the first and second reflow heating chambers 7a and 7b. In this stage, the standby flow rate Q3 is set so that the furnace wall temperatures of the respective inner walls of the preheating chambers 6a and 6b and the first and second reflow heating chambers 7a and 7b are maintained at the specified temperature of the reflow process. In this stage, the quantities of heat to be supplied to the preheating chambers 6a and 6b and the first and second reflow heating chambers 7a and 7b are reduced from those of the reflow process. Therefore, a consumption power W2 of the heaters 9a, 9b, 9c, and 9d becomes smaller than a consumption power W1 when the flow rates of the sirocco fans 12a, 12b, 12c, and 12d is the reflow process-use specified flow rate Q1.

When the circuit board passing monitor sensor 18a at the entrance 4 detects the passing of the circuit board 2, the controller 21 restores the flow rates of the sirocco fans 12a, 12b, 12c, and 12d from the standby flow rate Q3 to the reflow process-use specified flow rate Q1. That is, the controller 21 executes control so that the amounts of circulating air are restored from Q3 to Q1 when the circuit board 2 is conveyed by the conveyance section 3 and enters the preparatory chamber 6a that is the first preheating chamber after the circuit board passing monitor sensor 18a at the entrance 4 detects the passing of the circuit board 2. The flow rate Q3 in this stage is made, for example, about one half of the reflow process-use specified flow rate Q1.

With regard to these operations, an operator is allowed to confirm the presence or absence of the circuit board 2 inside the apparatus and manually change the flow rate setting of the sirocco fans 12a, 12b, 12c, and 12d.

According to the above construction, the quantity of supply heat can be controlled by executing control so as to switch the flow rates of the heated air to the standby flow rate Q3 smaller than the reflow process-use specified flow rate Q1 when no circuit board 2 exists inside the apparatus, and this allows a reflow apparatus of a reduced consumption power to be provided.

Third Embodiment

Figure 9:
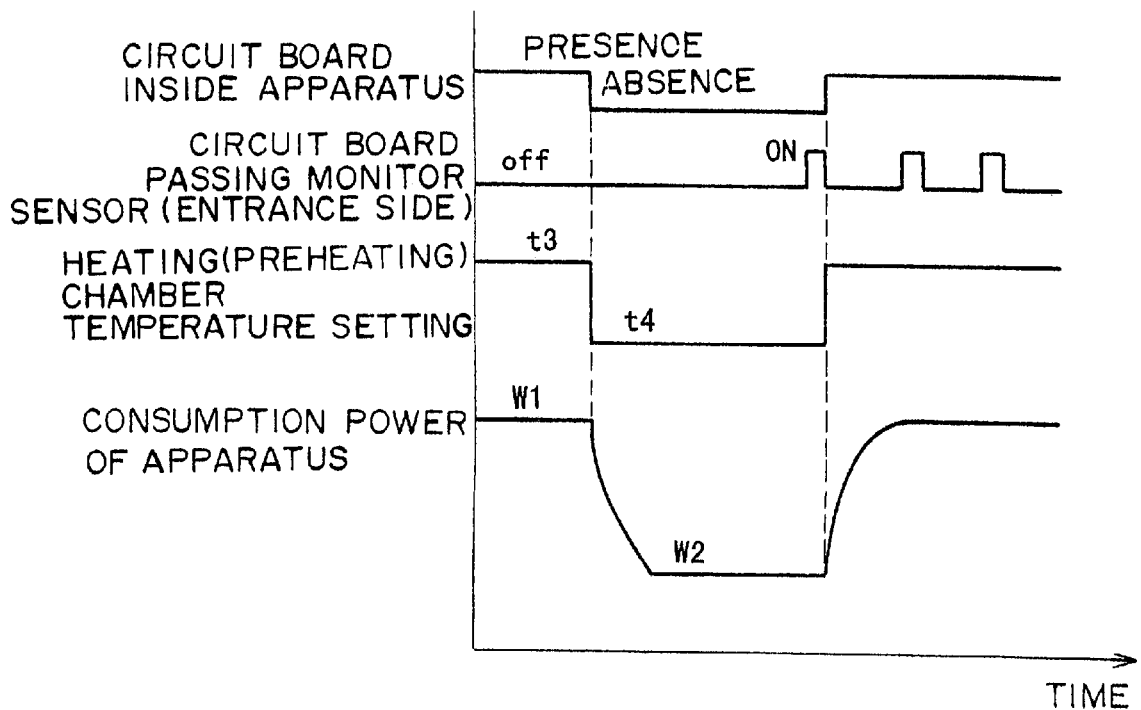
FIG. 9 is an operation timing chart of the reflow apparatus of the third embodiment of the present invention.
Figure 10:
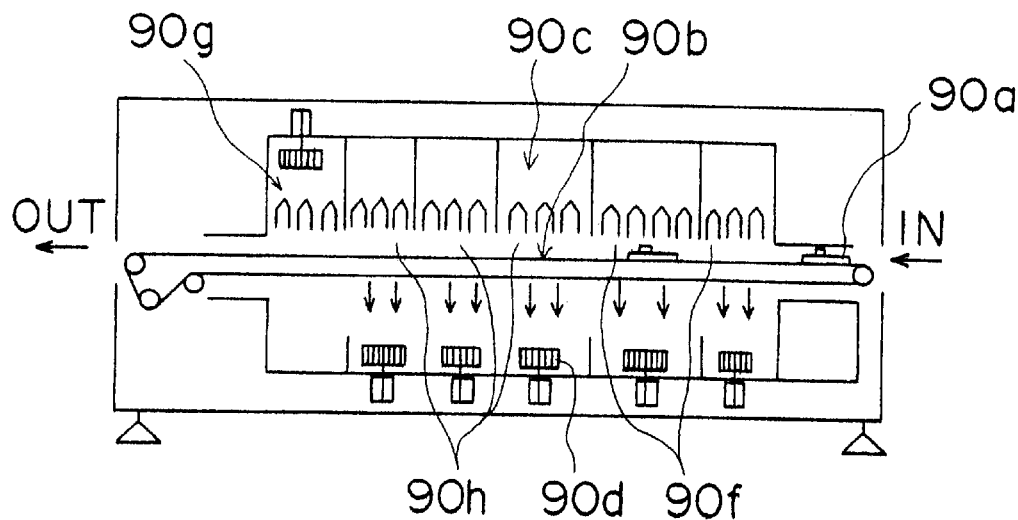
FIG. 10 is a front view of a prior art reflow apparatus.
Figure 11:
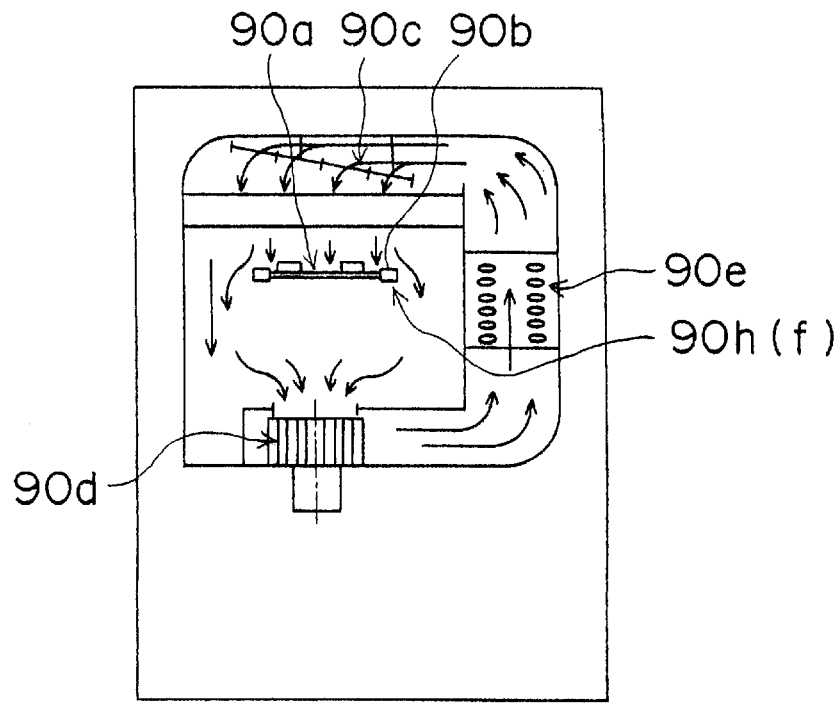
FIG. 11 is a side view of the reflow apparatus.
Figure 12:
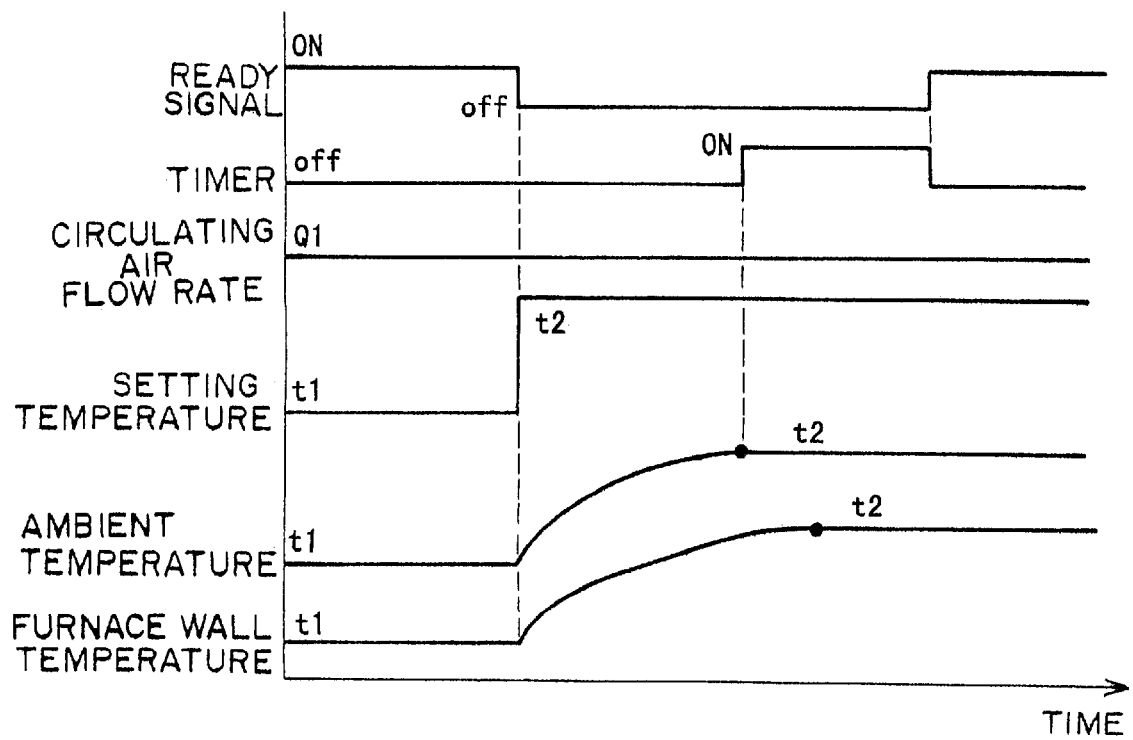
FIG. 12 is an operation timing chart of the prior art reflow apparatus.
Figure 13:
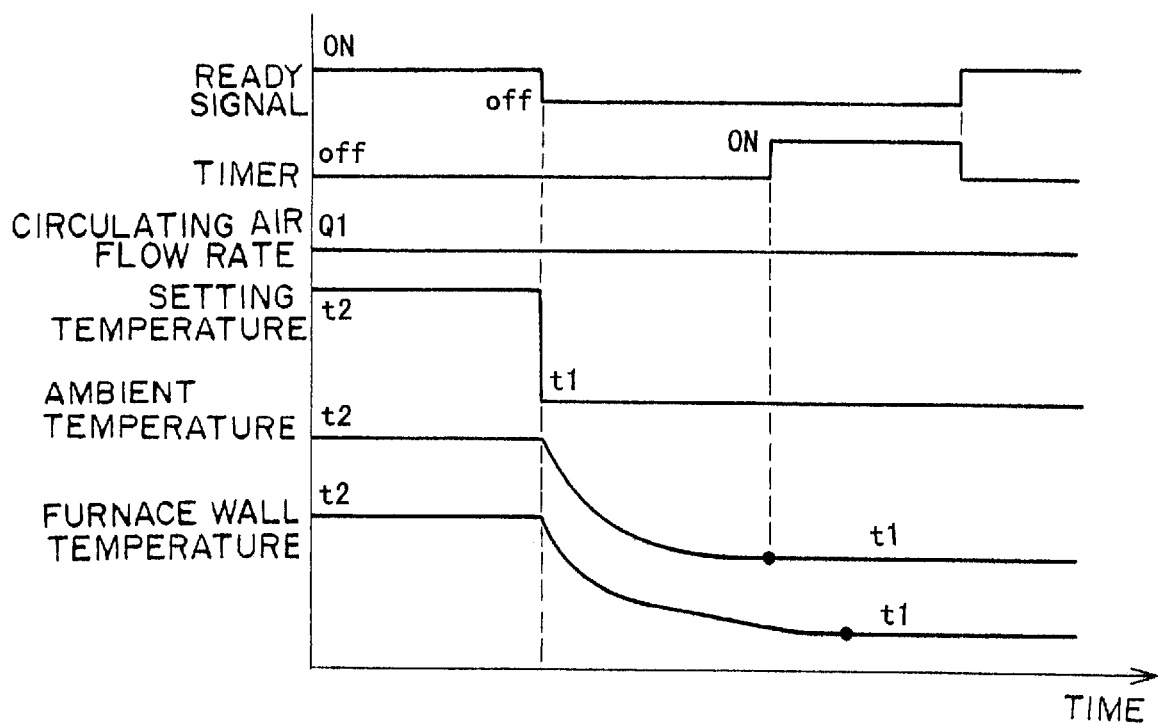
FIG. 13 is an operation timing chart of the prior art reflow apparatus.

FIG. 9 is an operation timing chart of a reflow apparatus and method according to a third embodiment of the present invention.

As shown in FIG. 3, the present third embodiment is to input to the controller 20 signals detected by circuit board passing monitor sensors 18a and 18b located at the entrance 4 and the exit 5 of the reflow apparatus 1 of the first embodiment, detect the presence or absence of a circuit board 2 in the reflow apparatus and switch the setting temperatures of the preheating chambers 6a and 6b and the first and second reflow heating chambers 7a and 7b from a high temperature t3 to a low temperature t4.

As shown in FIG. 9, when no circuit board 2 exists inside the reflow apparatus 1, the controller 21 switches the heating temperatures of the heaters 9a, 9b, 9c, and 9d from a reflow process-use specified temperature t3 to a standby temperature t4 (note that t4<t3) to lower the respective atmospheric temperatures of the preheating chambers 6a and 6b and the first and second reflow heating chambers 7a and 7b, thereby reducing the load of the heaters 9a, 9b, 9c, and 9d. In this stage, the flow rates of the sirocco fans 12a, 12b, 12c, and 12d are maintained at the reflow process flow rate(s). In this stage, the quantities of heat to be supplied to the preheating chambers 6a and 6b and the first and second reflow heating chambers 7a and 7b are reduced from those of the reflow process. Therefore, the consumption power W2 of the heaters 9a, 9b, 9c, and 9d becomes smaller than the consumption power W1 when the flow rates of the sirocco fans 12a, 12b, 12c, and 12d are the reflow process-use specified flow rate Q1.

When the circuit board passing monitor sensor 18a at the entrance 4 detects the passing of the circuit board 2, the controller 21 restores the heating temperatures of the heaters 9a, 9b, 9c, and 9d from the standby temperature t4 to the reflow process-use specified temperature t3.

With regard to these operations, an operator is allowed to confirm the presence or absence of the circuit board 2 inside the reflow apparatus 1 and manually change the setting temperatures of the heaters 9a, 9b, 9c, and 9d of the preheating chambers 6a and 6b and the first and second reflow heating chambers 7a and 7b.

According to the above construction, the quantities of supply heat can be controlled by switching the heating temperatures of the heaters 9a, 9b, 9c, and 9d from the reflow process-use specified temperature t3 to the standby temperature t4 for the control of the temperatures of the heated air when no circuit board 2 exists inside the apparatus, and this allows a reflow apparatus of a reduced consumption power to be provided.

In each of the aforementioned embodiments, it is allowed to control the quantities of heat to be supplied into the heating chambers by controlling the flow rates of the heating chambers, i.e., the preheating chambers 6a and 6b and the first and second reflow heating chambers 7a and 7b by means of the reflow apparatus 1, stabilize the heating chambers at the specified temperatures, and perform soldering of the electronic components 2a onto the circuit board 2 by melting the solder on arbitrary fabricating conditions. However, the present invention is not limited to this, and it is also possible to employ an electronic component fixing-use thermosetting adhesive or an encapsulation resin of an electronic component (an IC chip, for example) as an object to be heated, preheat the thermosetting adhesive or encapsulation resin in the preheating chambers 6a and 6b, and thereafter harden the thermosetting adhesive or encapsulation resin in the first and second reflow heating chambers, i.e., the hardening-use heating chambers 7a and 7b in this example even with a similar structure.

The above-mentioned heating apparatus and method can obtain operations and effects similar to those of the aforementioned embodiments.

It is to be noted that the present invention is not limited to the aforementioned embodiments and allowed to be embodied in a variety of other forms.

For example, it is also possible to individually control the flow rates of the sirocco fans 12a, 12b, 12c, and 12d in the preheating chamber 6a, the preheating chamber 6b, the first reflow heating chamber 7a, and the second reflow heating chamber 7b. It is also possible to individually control the flow rates of the sirocco fans 12c and 12d in the first reflow heating chamber 7a and the second reflow heating chamber 7b without any change in the preheating chamber 6a and the preheating chamber 6b. It is also possible to execute control so as to sequentially reduce the flow rates of the sirocco fans 12a, 12b, 12c, and 12d in the preheating chamber 6a, the preheating chamber 6b, the first reflow heating chamber 7a, and the second reflow heating chamber 7b in the heat treatment standby stage.

Figure 14:
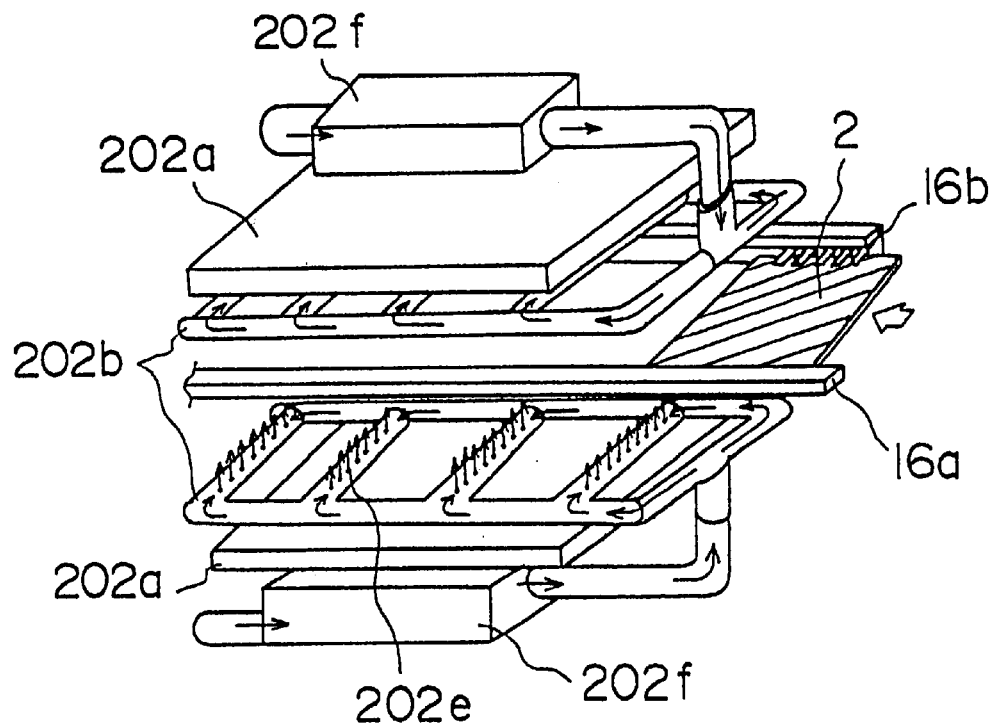
FIG. 14 is a perspective view of a non-circulation type heating apparatus according to another embodiment of the present invention.
Figure 15:
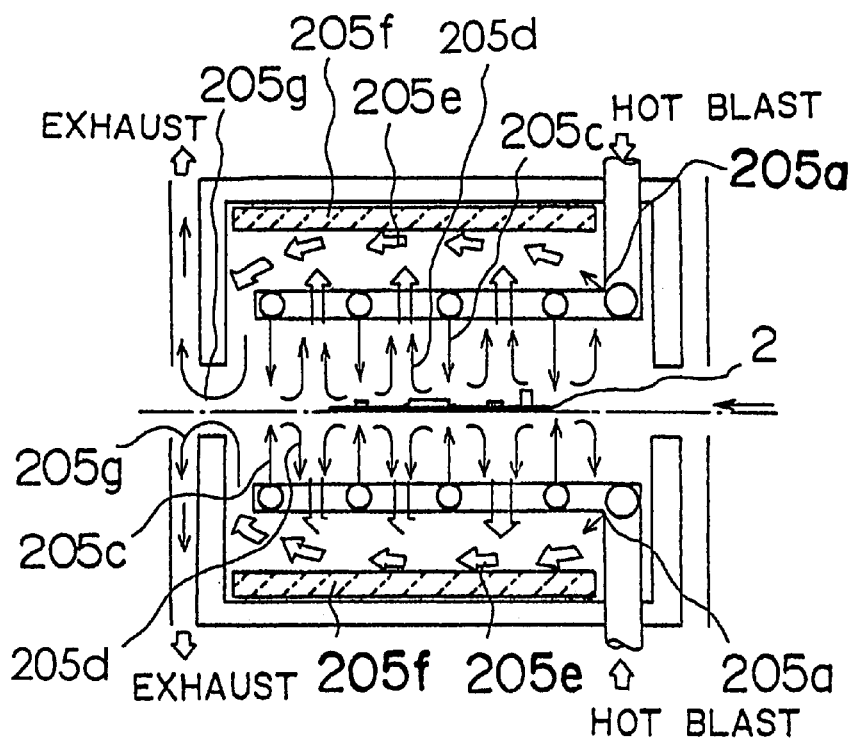
FIG. 15 is a chart of intra-furnace atmospheric air flow provided by hot blast blowout in the non-circulation type heating apparatus of FIG. 14.

The present invention can also be applied to the case where heated air is supplied as shown in FIG. 14 through FIG. 15 instead of circulating the heated air as shown in FIG. 1. That is, FIG. 14 shows the construction of the nozzle section of a non-circulation type heating apparatus according to another embodiment of the present invention. In FIG. 14, reference numeral 202a denotes a panel heater, 202b denotes a nozzle, 16a and 16b denote board conveyance sections, 2 denotes an electronic component mounting board, and 202e denotes an array of small holes formed in the nozzle 202b. Reference numeral 202f denotes a heater. Externally supplied air is heated to a specified temperature by the heater 202f. This heated air passes through the nozzle 202b and is blown as hot blast from the array of small holes 202e. The electronic component mounting board 2, which passes through each heating zone by the conveyance sections 16a and 16b, is heated from inside and from outside the surface of the board 2 by means of both heating by infrared rays radiated from the panel heater 202a onto the upper and lower surfaces and heating by heat transfer effected by hot blast that serves as a medium and is blown from the nozzle 202b in such a manner. FIG. 15 is a hot blast blowing nozzle shown in FIG. 14. In the figure, reference numeral 205a denotes a hot blast blowing hole formed at an angle of 45° with respect to the panel heater. Reference numeral 2 denotes the electronic component mounting board conveyed into the furnace. The arrows in the figure indicate the flow of air inside the furnace. The arrow 205c indicates the flow of hot blast of a constant temperature blown against the conveyance surface from the nozzle 202b, while the arrow 205d indicates the flow of atmosphere obtained by the rebounding hot blast blown from the nozzle 202b. The thick arrow 205e indicates the flow of the intra-furnace atmosphere formed by the hot blast blowing hole 205a. According to the above construction, when the board 2 is conveyed into the furnace, the board 2 is heated by the hot blast 205c of the constant temperature and the infrared rays radiated from the panel heater 205f. A hot blast 205d, which have conducted heat to the board 2 and then cooled, stays inside the furnace, but it is speedily discharged as an exhaust 205g out of the furnace by an air flow 205e. By this operation, the intra-furnace atmospheric temperature is not lowered by the loading of the board 2, and therefore, the temperature of the panel heater 205f also becomes stable. Therefore, the board 2 can be heated by the hot blast of a constant temperature and the infrared rays from the panel heater of a constant temperature. Thus, an identical temperature profile can consistently be obtained in soldering the board 2 even if boards 2 are continuously conveyed successively into the furnace. Furthermore, with the structure in which the atmosphere consistently circulates inside the furnace, the evaporated matter generated in the heating stage by the solder paste board 2 is also very speedily discharged. Therefore, every one of the aforementioned embodiments of the present invention can be applied to not only the circulation type heating apparatus of FIG. 1 but also the non-circulation type heating apparatus as shown in FIG. 14.

Figure 16:
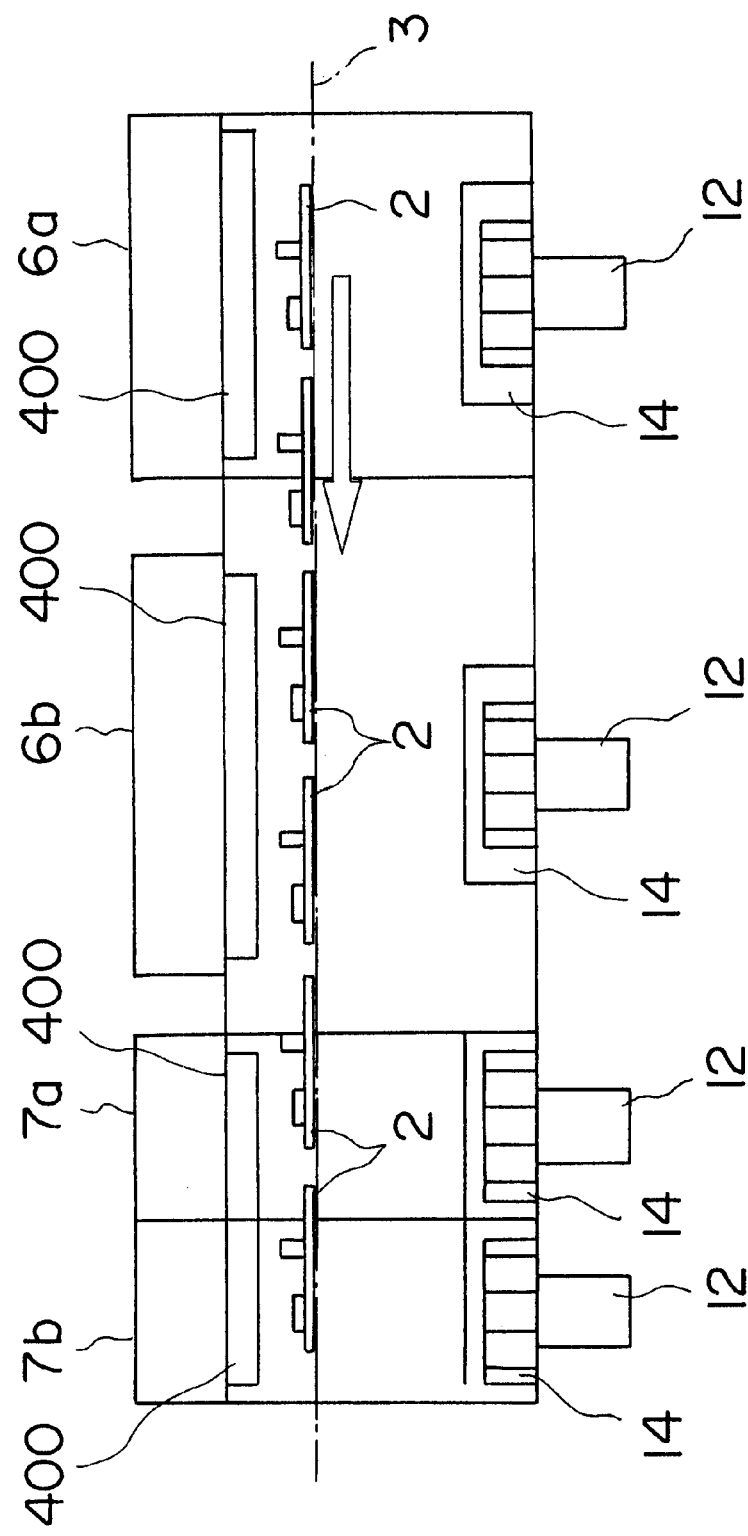
FIG. 16 is a schematic side view of a far-infrared type heating apparatus according to another embodiment of the present invention.
Figure 17:
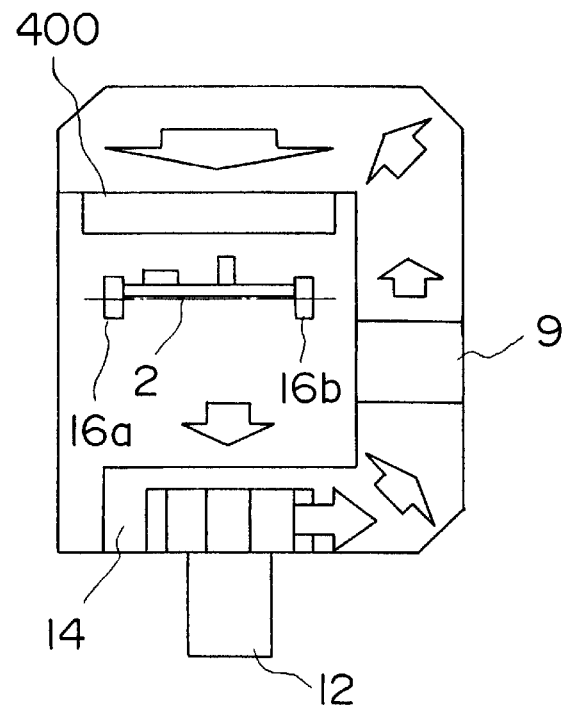
FIG. 17 is a schematic front view of the far-infrared type heating apparatus of FIG. 16.
Figure 18:
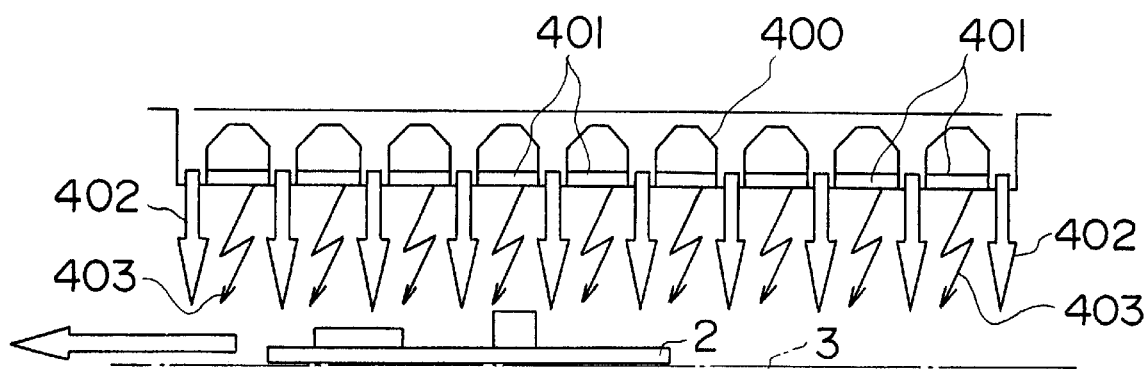
FIG. 18 is an enlarged schematic side view of a hot blast nozzle section of the far-infrared type heating apparatus of FIG. 16.

As yet another embodiment of the present invention, there may be an application of a far-infrared ray type heating apparatus as shown in FIG. 16 through FIG. 18. That is, a far-infrared ray heater 401 can also be controlled similarly to the aforementioned heater. In the figures, 400 denotes a hot blast nozzle, 402 denotes a hot blast, and 403 denotes a far-infrared ray radiant heat. In this case, it is preferable to control the temperatures of the far-infrared ray heaters 401 at least in the first reflow heating chamber 7a and the second reflow heating chamber 7b so as to reduce the temperatures in the standby stage.

Each of the aforementioned embodiments stands by until a specified time elapses according to the timer until the furnace wall temperature reaches the specified temperature. However, the present invention is not limited to this, and it is acceptable to provide each chamber with a furnace wall temperature sensor 117 and output a reflow process enable signal under the control of the controller 21 upon detecting that the furnace wall temperature has reached the specified temperature by the furnace wall temperature sensor 117, as shown in FIG. 1 and FIG. 3. With this arrangement, it is acceptable to output the reflow process enable signal when the furnace wall temperature sensor 117 detects that the furnace wall temperature has reached a tolerated range on the way to the achievement of the specified temperature even if the furnace wall temperature does not completely reach the specified temperature. The air flow rate of the cooling chamber 8 of each embodiment may also be subjected to similar control.

Each of the aforementioned embodiments is not limited to the board on which components are mounted. By applying each embodiment to the heat treatment of, for example, a wafer to which a substrate for interposer is bonded via bonding materials such as solder bumps in a wafer state, a wafer having bonding materials such as component mounting bumps in a state in which no component is mounted or the like and by controlling the quantity of supply heat (flow rate or temperature, for example) of the gas so that the quantity of supply heat (flow rate or temperature, for example) of the gas when no heat treatment is needed for the object to be heated is made smaller than the quantity of supply heat (flow rate or temperature, for example) of the gas when heat treatment is needed for the object to be heated in an optimum state for the board, wafer, component, and bonding material, the consumption power when no heat treatment for the bonding base object is needed can be reduced. Otherwise, by controlling the quantity of supply heat (flow rate, for example) of the gas so that the quantity of supply heat (flow rate, for example) of the gas is increased from the quantity of supply heat (flow rate, for example) of the gas when no setting changing of the temperature of the heating chamber is executed in changing the setting of the temperature of the heating chamber to another specified temperature for the setting changing of the atmospheric temperature of the heating chamber, the time required for the heating chamber to reach the specified temperature can be reduced. This improves the productivity and further reduces the time required for the setting temperature changing of the heating chamber, and therefore, the consumption power can be reduced. Therefore, in the control operation of the quantity of supply heat of the gas by the aforementioned heating apparatus and heating method, the heating control can also be executed with higher accuracy while taking the heat resistance temperature of the bonding base object such as a board and a component into consideration, and the generation of considerable warp of the bonding base object such as a wafer due to heat can also be restrained. Heating of the bonding materials such as solder and adhesive serving as the object to be heated can also be controlled to their respective optimum temperatures with high accuracy.

An experiment has proved the fact as follows. In the reflow apparatus of the aforementioned embodiment, within a temperature setting changing range of about 30° C. by switching the flow rate of the sirocco fans to a flow rate that is 1.2 to 1.5 times as large as the flow rate in the temperature setting changing stage, if the preheating chambers and the first and second reflow preheating chambers become internally thermally saturated, the flow rates of the sirocco fans are switched to the reflow process-use specified flow rates and the flows of the circulating air thereof and the temperatures inside the preheating chambers and the first and second reflow heating chambers are stabilized, then variations in the reflow process peak temperature of the circuit board with respect to the interval between circuit boards and a change in time falls within a range of about 3° C. immediately after the restoration of the flow rates of the sirocco fans, allowing a stable reflow process to be executed. In this stage, there are proved the effect of reducing the setting changing time from the room temperature from about 40 minutes in the conventional case to about 30 minutes (about 25% reduction) in relation to the apparatus consumption power as well as the effect of reducing the quantity of the consumption power from about 14 kWH to about 10 kWH (about 40% reduction).

Furthermore, the effects are great when the temperature changing range is about 30° C., and there is proved the effect of reducing the setting changing time from about 40 minutes in the conventional case to about 10 minutes (about 75% reduction).

According to other experiments, the consumption power is reduced from about 6 kWH to about 5 kWH by reducing the flow rates of the sirocco fans by 20% to 25% in the standby stage by comparison with that of the reflow process, proving the effect of reduction by about 1 kW (about 10% reduction). Also in this case, it is proved that the variations in the reflow process peak temperature of the circuit board with respect to the interval between circuit boards and a change in time falls within a range of about 3° C. immediately after the restoration of the flow rates of the sirocco fans, allowing a stable reflow process to be executed.

According to the present invention, by controlling the quantity of supply heat (flow rate or temperature, for example) of the gas so that the quantity of supply heat (flow rate or temperature, for example) of the heated gas when no heat treatment is needed for the object to be heated is made smaller than the quantity of supply heat (flow rate or temperature, for example) of the gas when heat treatment is needed for the object to be heated, the consumption power when no heat treatment for the bonding base object is needed can be reduced.

Furthermore, according to the present invention, if the quantity of supply heat (flow rate, for example) of the gas is controlled so that the quantity of supply heat (flow rate, for example) of the gas is increased from the quantity of supply heat (flow rate, for example) of the gas when no setting changing of the temperature of the heating chamber is executed in changing the setting of the temperature of the heating chamber to another specified temperature for the setting changing of the atmospheric temperature of the heating chamber, the time required for the heating chamber to reach the specified temperature can be reduced. This improves the productivity and further reduces the time required for the setting temperature changing of the heating chamber, and therefore, the consumption power can be reduced.

According to the present invention, with the above-mentioned construction, it is detected whether the bonding base object has passed through the entrance and exit of the heating apparatus including the heating chamber. Gas supply heat quantity control is executed so as to determine that heat treatment for the object to be heated is needed upon detecting the presence of the bonding base object within the heating method to supply a quantity of supply heat (flow rate or temperature, for example) for heat treatment use as the quantity of supply heat (flow rate or temperature, for example) of the gas and determine that no heat treatment for the object to be heated is needed upon detecting the absence of the bonding base object within the heating method to supply a quantity of standby supply heat (flow rate or temperature, for example) smaller than the quantity of supply heat (flow rate or temperature, for example) of the gas. By this control, the standby supply heat (flow rate or temperature, for example) of the gas can be reduced and the consumption power can be reduced.

A reflow apparatus as an example for embodying a heating apparatus and heating method according to a fourth embodiment of the present invention will be described with reference to FIG. 19 through FIG. 22.

Figure 19:
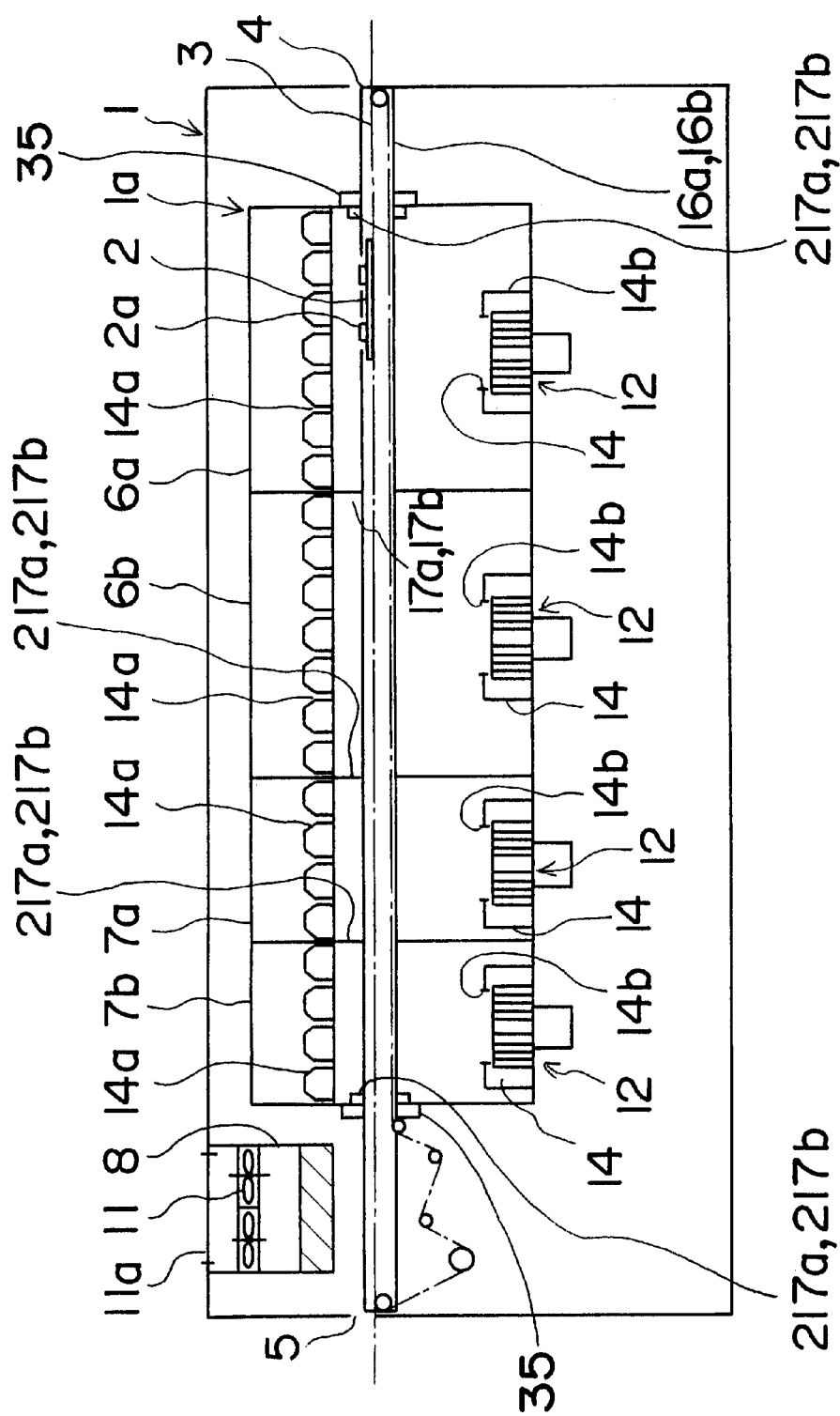
FIG. 19 is a front view of a reflow apparatus serving as an example of a heating apparatus according to a fourth embodiment of the present invention.

As shown in FIG. 19, the reflow apparatus is a reflow apparatus provided with a conveyance section 3 for conveying a bonding base object on which electronic components 2a are mounted; four heating chambers 6a, 6b, 7a, and 7b that include this conveyance section 3, provides a specified temperature by supplying (in other words, supplying with circulation or supplying without circulation) heated gas via heating devices (for example, heaters 9a, 9b, 9c, and 9d), supplies at a specified flow rate the heated gas of a specified temperature as a heating source onto the bonding base object, and heats the object to be heated such as solder on the bonding base object; a cooling chamber 8 that is located adjacent to the heating chambers rearwardly in a direction in which the bonding base object is conveyed and cools and solidifies melted solder; and circuit board detecting devices 18a and 18b for detecting the fact that the bonding base object has passed through apparatus entrance 4 and exit 5.

The reflow apparatus of the fourth embodiment employs heated air as an example of the heated gas and employs a circuit board as an example of the bonding base object on which components are mounted. However, the present invention is not limited to this and allowed to employ an inert gas such as nitrogen gas as another example of the heated gas. Furthermore, a component on which an electronic component can be mounted can be employed as another example of the bonding base object. In the reflow apparatus of the fourth embodiment, the object to be heated is solder paste taken as an example of the bonding material for bonding the electronic component 2a to the circuit board 2. However, the present invention is not limited to this and allowed to employ an electronic component fixing use thermosetting adhesive or a conductive adhesive or an encapsulation resin of an electronic component (IC chip, for example). Furthermore, in the reflow apparatus of the fourth embodiment, the heating chamber is provided by the four heating chambers, i.e., the first preheating chamber 6a, the second preheating chamber 6b, the first reflow heating chamber 7a, and the second reflow heating chamber 7b as one example. However, the present invention is not limited to this and allowed to employ one reflow heating chamber or a combination of one preparatory chamber and one reflow heating chamber. As an example of the heating apparatus, the reflow apparatus for heating and melting the reflow-use solder on the bonding base object is taken as an example. However, the present invention is not limited to this and also allowed to be applied to a thermal hardening apparatus for hardening an electronic component fixing use thermosetting adhesive or a conductive adhesive or an encapsulation resin of an electronic component (IC chip, for example).

Figure 20:
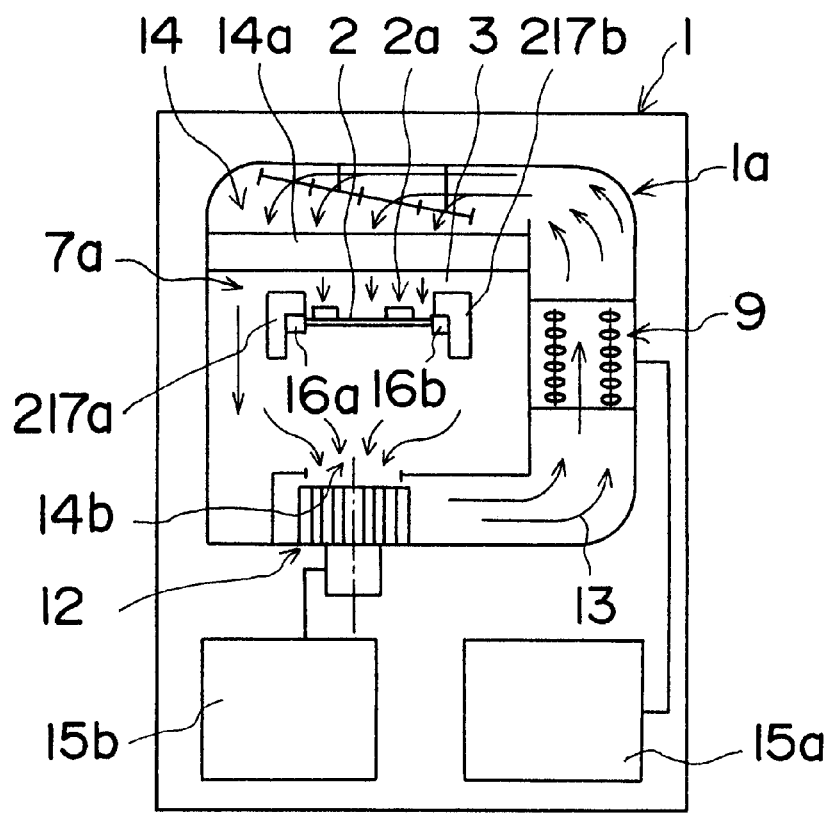
FIG. 20 is a side view of the reflow apparatus of FIG. 19.

As shown in FIG. 19, the reflow apparatus has a conveyance section 3 such as a belt conveyor for conveying a circuit board 2 from the entrance 4 to the exit 5 of the reflow apparatus 1 as well as a first preheating chamber 6a, a second preheating chamber 6b, a first reflow heating chamber 7a, and a second reflow heating chamber 7b and a cooling chamber 8, which are arranged in this order from the entrance 4 side to the exit 5 side and which constructed the furnace section la. As shown in FIG. 20, the first and second preheating chambers 6a and 6b and the first and second reflow heating chambers 7a and 7b have hot blast circulating units 14 each of which has a sirocco fan 12 (12a, 12b, 12c, 12d) for circulating air and heaters 9a, 9b, 9c, and 9d for heating the circulating air 13. The heater 9 and the sirocco fan 12 are supplied with electric power from electric power supply sources 15a and 15b, respectively. A hot blast outlet port 14a of this hot blast circulating unit 14 is located above the conveyance section 3 and blows heated air against the upper surface of the circuit board 2. On the other hand, a hot blast inlet port 14b of the hot blast circulating unit 14 is located below the conveyance section 3 and takes in the heated air. The cooling chamber 8 is constructed of a fresh air intake port 11a and a cooling-use axial flow fan 11.

Figure 21:
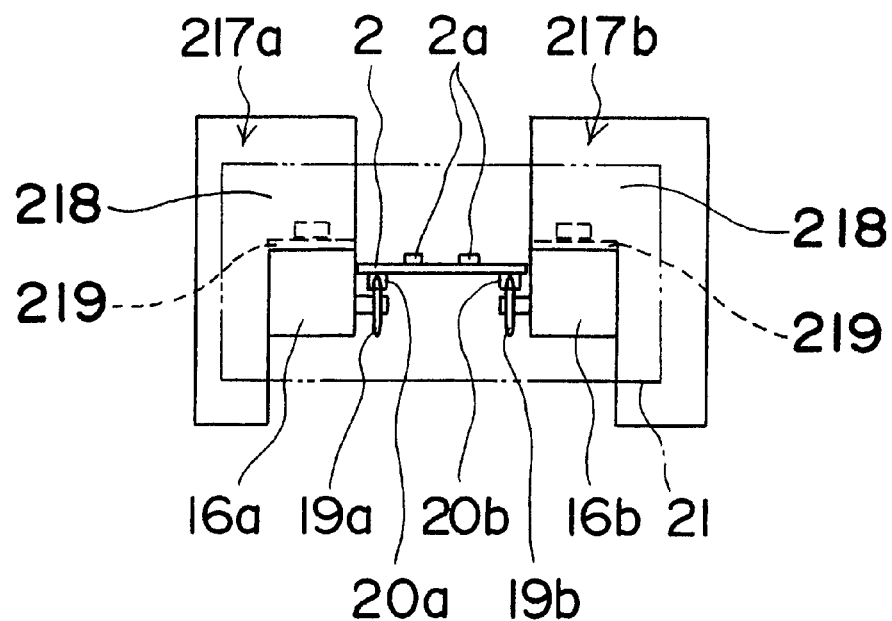
FIG. 21 is a side view of a conveyance section of the reflow apparatus of the fourth embodiment of the present invention.

The feature of the fourth embodiment will be described with reference to FIG. 21. FIG. 21 is a sectional view of the conveyance section 3 in the vicinity of the boundary between chambers, or for example, the boundary between the first reflow heating chamber 7a and the second reflow heating chamber 7b. In the conveyance section 3, sprockets 19a and 19b are rotatably fixed to a pair of rail sections 16a and 16b arranged in correspondence with both side ends of the board 2. The circuit board 2 is conveyed in a direction perpendicular to the figure by chains 20a and 20b engaged and supported by sprockets 19a and 19b.

Figure 22:
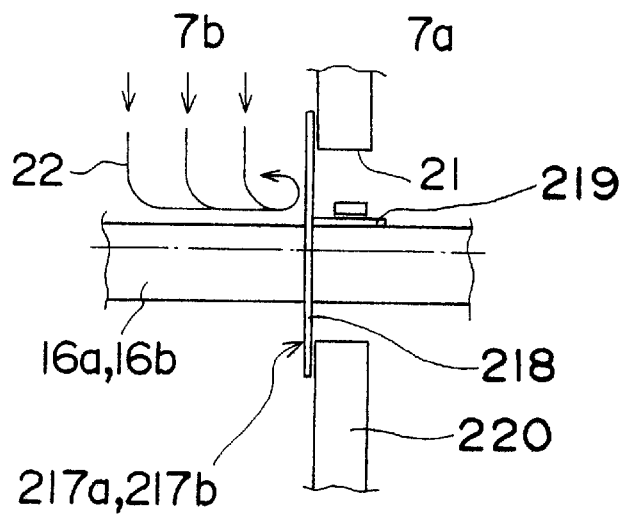
FIG. 22 is a front view of part of the conveyance section of the reflow apparatus of the fourth embodiment of the present invention.

The feature of the fourth embodiment is that shield plates 217a and 217b serving as an example of the heated gas flow path control member are provided above the pair of rail sections 16a and 16b of the conveyance section 3. The shield plates 217a and 217b are each provided with a flat surface section 218 that extends in a direction perpendicular to the lengthwise direction of the rail sections 16a and 16b, and a fastening section 219 that protrudes from the flat surface section 218, extends in the lengthwise direction of the rail sections 16a and 16b and is fixed to the rail sections 16a and 16b. This flat surface section 218 is to close a space above each rail section at the boundary between the heating chamber and the outside of the heating chamber (in other words, the boundary between adjoining heating chambers, i.e., the boundary between adjoining preheating chambers, the boundary between adjoining preheating chamber and reflow heating chamber, the boundary between adjoining reflow heating chambers, the boundary between adjoining reflow heating chamber and cooling chamber, the boundary between the cooling chamber and the atmosphere outside the reflow apparatus and so on) and thus blocks the flow of heated air that tries to advance from each heating chamber toward the outside of the heating chamber via the space above each rail section. That is, as shown in FIG. 22, for example, in a left-hand heating chamber (second reflow heating chamber 7b, as an example), the path 22 of the heated air, which tries to flow along the upper surface of the rail section toward the outside of the heating chamber (the right-hand heating chamber (first reflow heating chamber 7a, as an example) in FIG. 22) is blocked by the shield plates 217a and 217b. It is to be noted that reference numeral 21 denotes a board conveyance opening formed at a partition wall 220 for partitioning the heating chambers of the furnace section 1 and connects adjoining heating chambers.

As shown in FIG. 19, it is effective to arrange the shield plates 217a and 217b at least in a portion which belongs to the reflow apparatus 1 and in which a temperature difference becomes large, i.e., at the entrance of the first preparatory chamber 6a and the exit of the second reflow heating chamber 7b of the reflow apparatus 1. It is more preferable to arrange the shield plates at the boundary between the first preparatory chamber 6a and the second preparatory chamber 6b, the boundary between the second preparatory chamber 6a and the first reflow heating chamber 7a, and the boundary between the first reflow heating chamber 7a and the second reflow heating chamber 7b.

Although the flat surface sections 218 of the shield plates 217a and 217b extend in the direction perpendicular to the board conveyance direction, the sections are not necessarily arranged perpendicular to the board conveyance direction. As described above, the shield plates may be extended in a direction intersecting the board conveyance direction at an arbitrary angle if the flow of the heated air directed toward the outside of the heating chamber can be blocked.

The operation of the present fourth embodiment in the case where the circuit board 2 is subjected to the reflow process in the reflow apparatus 1 will be described next with reference to FIG. 19 through FIG. 25.

In FIG. 19 and FIG. 20, the circuit board 2 having an upper surface on which the components 2a are placed on solder pastes is conveyed from the entrance 4 to the exit 5 of the reflow apparatus 1 by the conveyance section 3.

Figure 23:
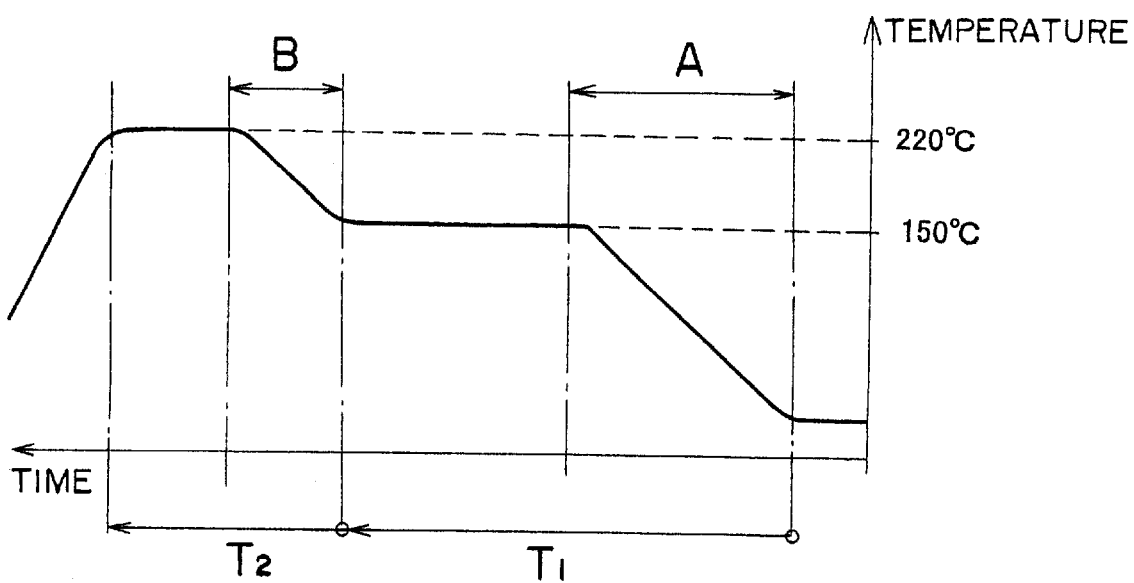
FIG. 23 is a graph showing the temperature profile of the reflow apparatus of the fourth embodiment of the present invention.
Figure 24:
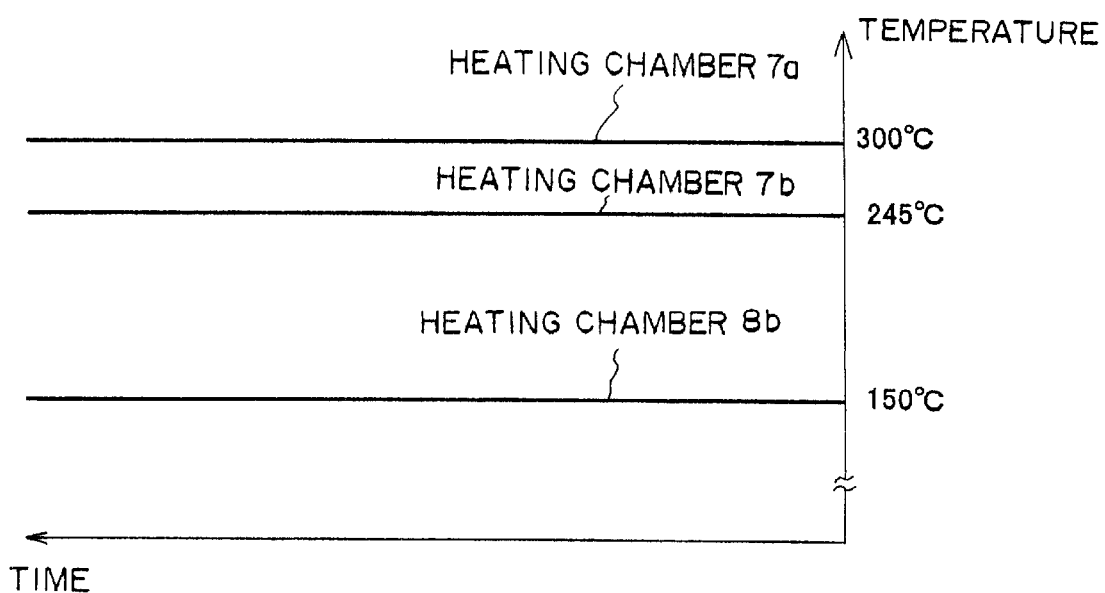
FIG. 24 is a graph showing the heated air temperatures of the chambers of the reflow apparatus of the fourth embodiment of the present invention.

In this case, the circuit board 2, which sequentially passes through the first preheating chamber 6a, the second preheating chamber 6b, the first reflow heating chamber 7a, and the second reflow heating chamber 7b, is heated as shown in FIG. 23 to a temperature of about 150° C. in a preheating interval T1 inside the first and second preheating chambers 6a and 6b to preliminarily heat the solder, heated to a temperature of about 220° C. in a reflow heating interval T2 inside the first and second reflow heating chambers 7a and 7b to heat the solder to the melting temperature, and cooled to solidify the melted solder in the cooling chamber 8. In the above stage, the temperature of the heater 9 and the flow rate of the sirocco fan 12 of the first and second preheating chambers 6a and 6b and the temperature of the heater 9 and the flow rate of the sirocco fan 12 of the first and second reflow heating chambers 7a and 7b are set to the temperatures and flow rates corresponding to the thermal capacity of the circuit board 2 to be subjected to the reflow process. That is, the temperature of the heated air of each chamber is controlled to a temperature corresponding to the thermal capacity of the circuit board 2 at the start and a preparation process of the reflow apparatus 1, as shown in FIG. 24. In this stage, the paths of the heated air that flows along the upper surfaces of the rail sections are blocked by the shield plates 217a and 217b so as to reduce the thermal interference between the chambers, enabling the reduction in power.

Figure 25:
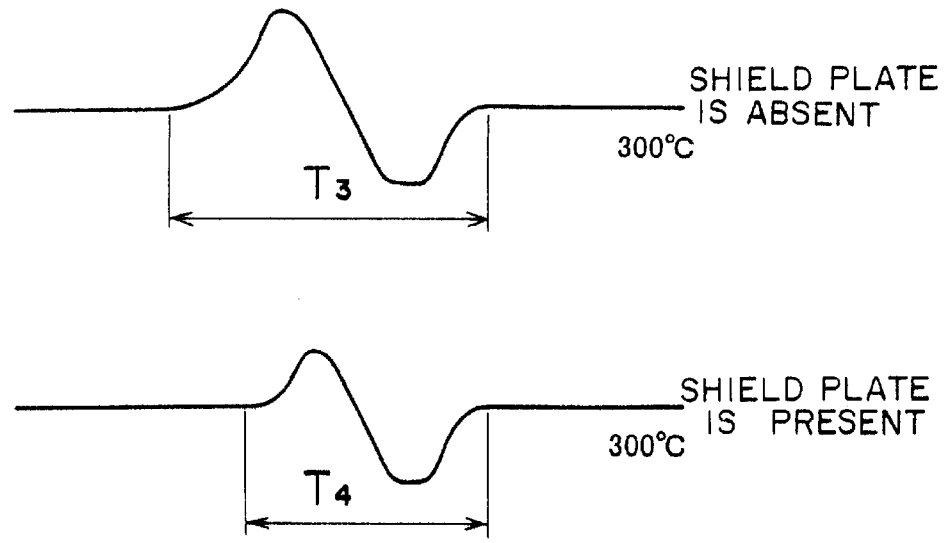
FIG. 25 is a chart showing a heated air temperature when loading a board into the heating chamber of the reflow apparatus of the fourth embodiment of the present invention.

Furthermore, if the circuit board 2 is loaded, then a disorder as shown in FIG. 25 occurs in the temperature of the heated air of each chamber. If a circuit board loading interval is shorter than a time T3 required for the restoration of the disorder into a stable state when circuit boards 2 are continuously loaded, then the next circuit board 2 is to be exposed to a temperature higher or lower than that of the previous circuit board 2, causing variations in quality. However, in the case where the shield plates 217a and 217b are provided, a time T4 required for the restoration of the disorder into the stable state becomes T3>T4, and this enables a reduction in electric power and a reduction in the circuit board loading interval, i.e., an improvement in productivity.

A reflow apparatus according to a fifth embodiment of the present invention will be described next with reference to FIG. 26 and FIG. 27.

The fifth embodiment differs from the fourth embodiment in that the fifth embodiment is provided with shield plates 23a and 23b that serve as a second example of the heated gas flow path control member curved in both adjoining space directions in contrast to the fourth embodiment provided with the shield plates 217a and 217b. The shield plates 23a and 23b are each arranged so as to be fit in a space between each rail section and the partition wall 220 and have a curved shape such that the approximate center portion is concaved toward the outside of the heating chamber and the upper and lower end portions that interpose the approximate center portion between them protrude toward the heating chamber. The other part is the same as that of the fourth embodiment, and therefore, same components are denoted by same reference numerals with no description provided for them.

Figure 26:
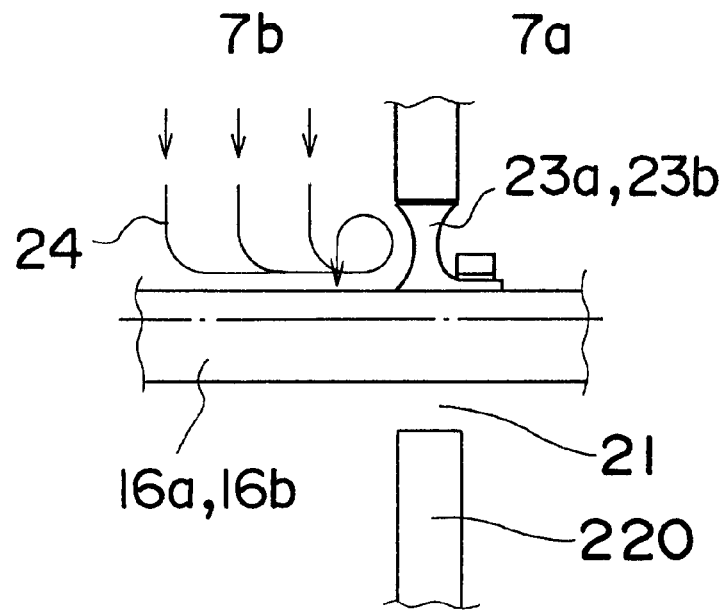
FIG. 26 is a front view of part of the conveyance section of a reflow apparatus according to a fifth embodiment of the present invention.
Figure 27:
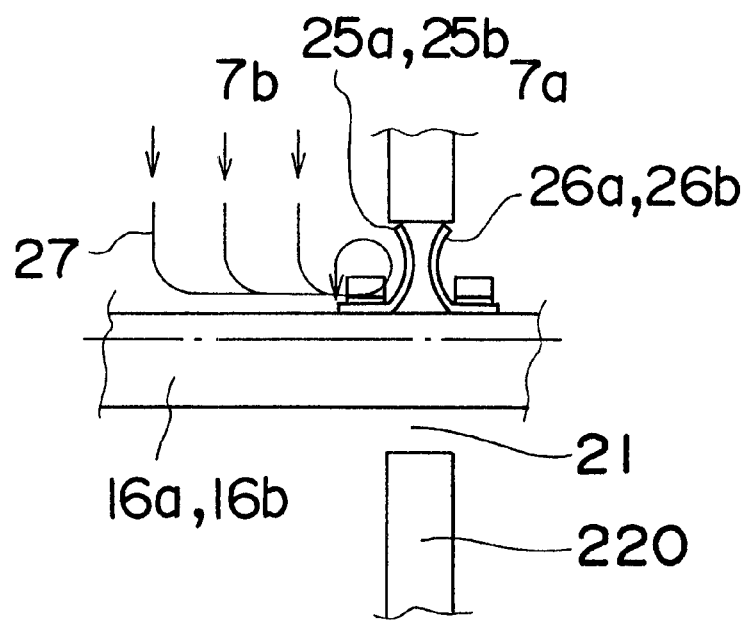
FIG. 27 is a front view of part of the conveyance section of a reflow apparatus according to a modification example of the fifth embodiment of the present invention.

According to the above-mentioned construction, paths 24 of the heated air that tries to flow outwardly of the heating chamber (toward the right-hand heating chamber (first reflow heating chamber 7a, as one example) in FIG. 27) along the upper surfaces of the rail sections in, for example, the left-hand heating chamber (second reflow heating chamber 7b, as an example) in FIG. 26 are blocked by the shield plates 23a and 23b, directed smoothly along the rail section upper surfaces upward in the left-hand heating chamber via the curved surfaces of the shield plates 23a and 23b, and allowed to merge into the flow of heated air from the upper portion to the lower portion of the left-hand heating chamber. Therefore, the same operation as that of the fourth embodiment can be obtained, and more stable circulating air can be obtained. That is, the heated air blocked by the curved shape of the shield plates 23a and 23b can be put back to each chamber without stagnation, and the board 2 can be stably heated to the specified temperature, allowing the heat treatment to be executed with high reliability.

Furthermore, as a modification example of the shield plates 23a and 23b of FIG. 26, it is acceptable to arrange parallel pairs of shield plates 25a, 25b, 26a, and 26b curved in both adjoining spaces as shown in FIG. 27. That is, the pairs of shield plates 25a and 25b are arranged parallel along the conveyance direction in the rail section 16a, while the pairs of shield plates 26 and 26b are arranged parallel along the conveyance direction in the rail section 16b. The shield plates 25a, 25b, 26a, and 26b constructed as above have an exterior shape approximately equal to that of the foregoing shield plates 23a and 23b of FIG. 26. The other part is the same as that of the fourth embodiment, and therefore, same components are denoted by same reference numerals with no description provided for them.

According to the above-mentioned construction, a paths 27 of the heated air that tries to flow outwardly of the heating chamber (toward the right-hand heating chamber (first reflow heating chamber 7a, as one example) in FIG. 27) along the upper surfaces of the rail sections in, for example, the left-hand heating chamber (second reflow heating chamber 7b, as an example) in FIG. 27 are blocked by the shield plates 25a and 25b, directed smoothly along the rail section upper surfaces upward in the left-hand heating chamber via the curved surfaces of the shield plates 25a and 25b, and allowed to merge into the flow of heated air from the upper portion to the lower portion of the left-hand heating chamber. Therefore, the same operation as that of the fourth embodiment can be obtained, and more stable circulating air can be obtained.

Next, a reflow apparatus according to a sixth embodiment of the present invention will be described next with reference to FIG. 28.

The present embodiment differs from the fourth embodiment in that the sixth embodiment is provided with shield plates 28a and 28b including a heat insulator 29 made principally of a material of, for example, calcium silicate for controlling heat conduction from the heated gas toward the outside of the heating chamber in contrast to the fourth embodiment provided with the shield plates 217a and 217b. The other part is the same as that of the fourth embodiment, and therefore, same components are denoted by same reference numerals with no description provided for them.

Figure 28:
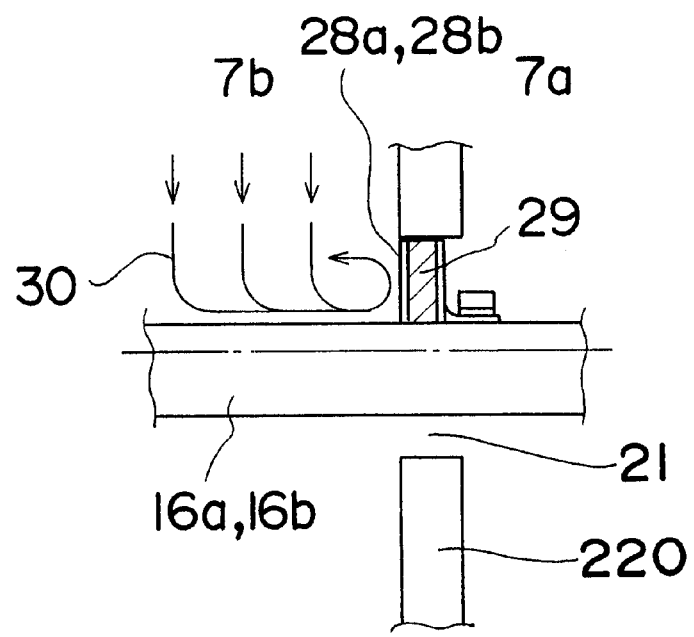
FIG. 28 is a front view of part of the conveyance section of a reflow apparatus according to a sixth embodiment of the present invention.

According to the above-mentioned construction, a paths 30 of the heated air that tries to flow outwardly of the heating chamber (toward the right-hand heating chamber (first reflow heating chamber 7a, as one example) in FIG. 28) along the upper surfaces of the rail sections in, for example, the left-hand heating chamber (second reflow heating chamber 7b, as an example) in FIG. 28 are blocked by the shield plates 28a and 28b. Furthermore, the heat conduction from the heated gas toward the outside of the heating chamber via the shield plates 28a and 28b can be restrained by the heat insulator 29. Therefore, the same operation as that of the fourth embodiment can be obtained, and the heat conduction can also be restrained. That is, the heat conduction between the heating chamber and the outside of the heating chamber via the shield plates 28a and 28b can also be reduced, and the circuit board 2 can be stably heated to the specified temperature, allowing the heat treatment to be executed with high reliability.

The present embodiment can produce the aforementioned heat conduction restraining effect by being combined with another arbitrary embodiment.

A reflow apparatus according to a seventh embodiment of the present invention will be described next with reference to FIGS. 29A and 29B.

The seventh embodiment differs from the fourth embodiment in that rail sections 31a and 31b have a mountain-like cross-section shape or the rail sections 31a and 31b preferably have an upper portion of a triangular cross-section shape in the seventh embodiment in contrast to the fourth embodiment provided with the shield plates 217a and 217b. In detail, each of the rail sections 31a and 31b has a pentagonal cross-section shape. The other part is the same as that of the fourth embodiment, and therefore, same components are denoted by same reference numerals with no description provided for them.

Figures 29A, 29B:
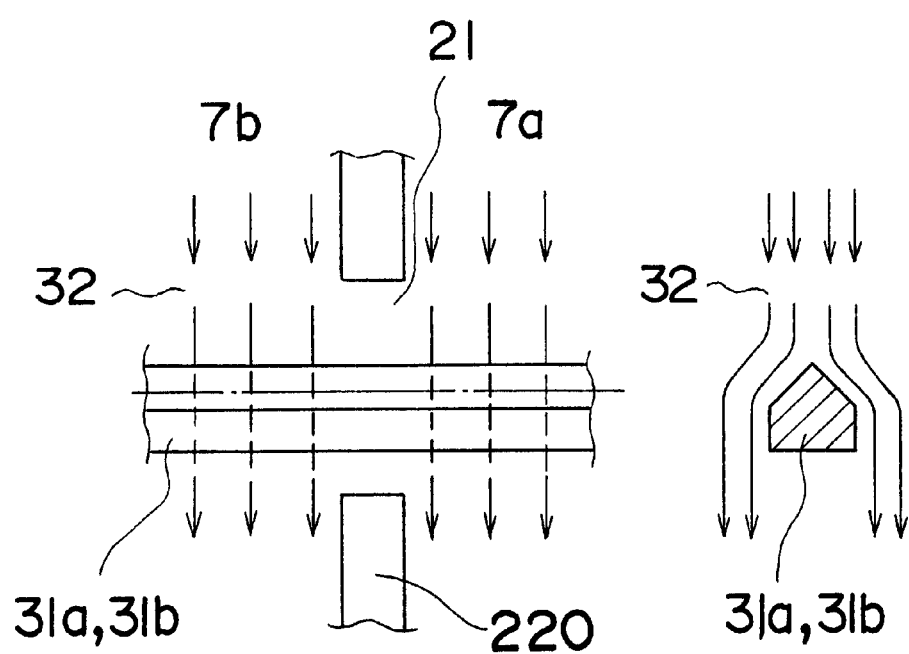
FIG. 29A and FIG. 29B are a front view and a side view of part of the conveyance section of a reflow apparatus according to a seventh embodiment of the present invention.

According to the above-mentioned construction, in FIG. 29A and 29B, heated circulating air 32 flows from the upper portion to the lower portion along the mountain-like shape of the rail sections 31a and 31b in the heating chamber (first reflow heating chamber 7a and second reflow heating chamber 7b, as an example). Therefore, the flow of heated air toward the outside of the heating chamber through an opening 21 located between each heating chamber and the outside of the heating chamber, along the upper surface of the rail as in the conventional case, can be reduced.

A reflow apparatus according to an eighth embodiment of the present invention will be described next with reference to FIG. 30A and 30B.

The eighth embodiment differs from the seventh embodiment in that the upper surfaces of rail sections 33a and 33b are sloped so as to be lowered toward the opposite side of the circuit board 2 conveyed by the rail sections 33a and 33b in contrast to the seventh embodiment whose rail sections 31a and 31b have a mountain-like cross-section shape.

Figure 30A:
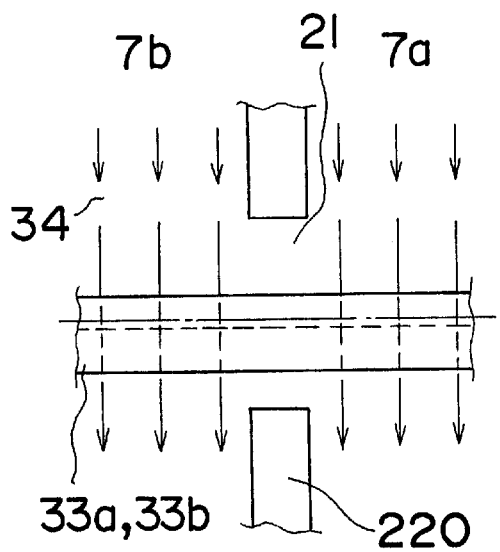
FIG. 30A and FIG. 30B are a front view and a side view of part of the conveyance section of a reflow apparatus according to an eighth embodiment of the present invention.
Figure 30B:
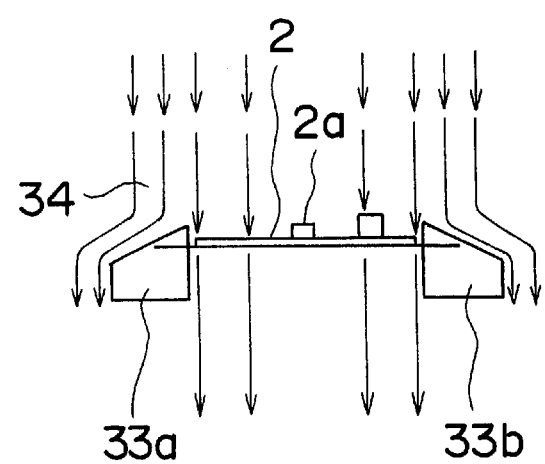

According to the above-mentioned construction, in FIGS. 30A and 30B, heated circulating air 34 flows from the upper portion to the lower portion along the slopes of the upper surfaces of the rail sections 33a and 33b so as to be lowered toward the opposite side of the circuit board 2 in the heating chamber (first reflow heating chamber 7a and second reflow heating chamber 7b, as an example). In particular, by sloping the upper surfaces of the rail sections 33a and 33b toward the opposite side of the circuit board 2 conveyed by the rail sections 33a and 33b, only the heated air located just above the board can be uniformly applied to the circuit board 2 that is the object to be heated. Therefore, the flow of the heated air through the opening 21 of the partition wall 220 located between each heating chamber and the outside of the heating chamber, along the upper surfaces of the rail sections as in the conventional case, can be reduced, and variations in temperature of the entire surface of the circuit board 2 to be heated can be reduced, allowing the heating to be uniformly performed.

A reflow apparatus according to a ninth embodiment of the present invention will be described next.

The ninth embodiment is to concurrently put the fourth embodiment and the seventh embodiment into practice, and an operation of a combination of the operations of the fourth embodiment and the seventh embodiment can be obtained.

Therefore, no description is provided.

Furthermore, an operation similar to that of the ninth embodiment can be obtained by putting any one of the fourth, fifth, and sixth embodiments into practice concurrently with either one of the seventh and eighth embodiments.

A reflow apparatus according to a tenth embodiment of the present invention will be described next with reference to FIG. 31 and FIG. 32.

Figure 33:
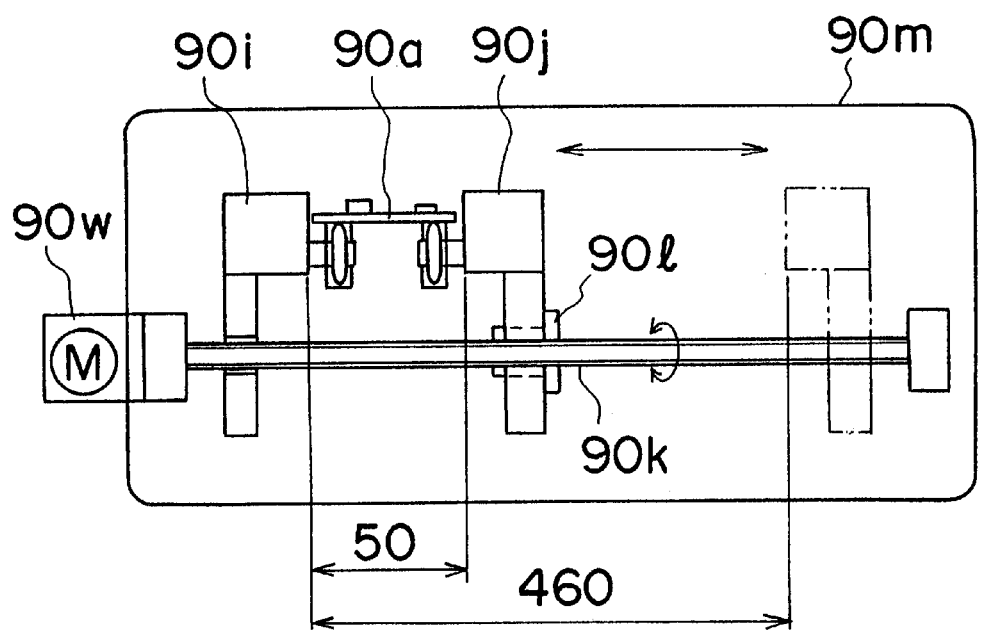
FIG. 33 is a side view showing a conveyance unit of the conveyance section of a general reflow apparatus.
Figure 34:
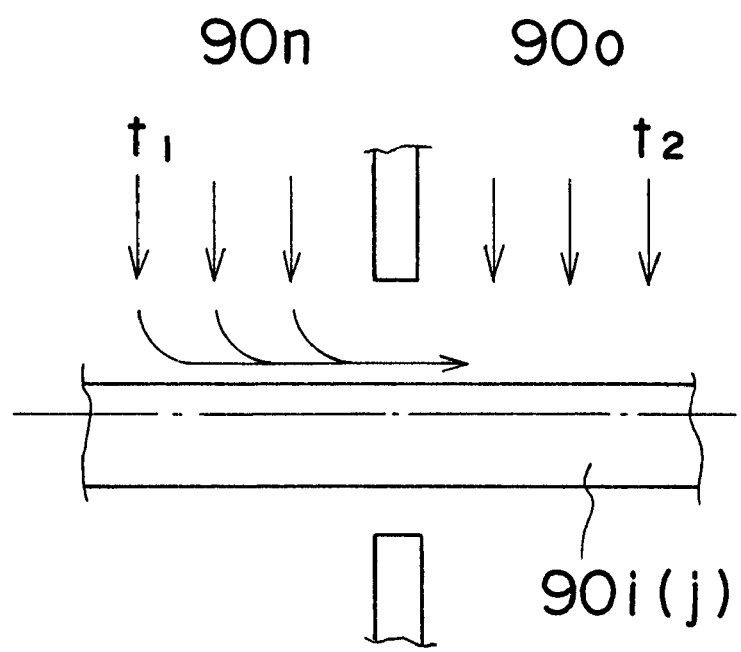
FIG. 34 is a view of the principle of thermal interference between the chambers of a general reflow apparatus.

The tenth embodiment differs from the fourth embodiment in that, in contrast to the fourth embodiment provided with the shield plates 217a and 217b, the other movable rail section 16b of a pair of rail sections is arranged slidably within a range of, for example, 50 mm to 460 mm in a direction in which the movable rail section moves close to and apart from a fixed rail section 16a with respect to the fixed rail section 16a of the pair of rail sections. A shield plate 35 of a size capable of closing a region other than a region that belongs to the opening 21 and is necessary for board conveyance (if possible, capable of blocking even a flow of heated air indicated by an arrow 22g that is formed of a downward flow of heated air colliding against the board 2 and flows outwardly of the heating chamber along the board, in FIG. 35) is fixed to the movable rail section 16b at the entrance and exit located between the heating chamber and the outside of the heating chamber, and the shield plate 35 is engaged integrally with the movement of the movable rail section 16b in a direction perpendicular to the board conveyance direction while being guided by a guide 36. With this arrangement, by moving the movable rail section 16b (by utilizing a drive mechanism as shown in FIG. 33) with respect to the fixed rail section 16a according to the size of the board 2, the region other than the region that belongs to the opening 21 and is necessary for conveying the board can be closed by the shield plate 35. Depending on cases, a region corresponding to a space above the board conveyance region is not required to be shielded by the shield plate. The other part is the same as that of the fourth embodiment, and therefore, same components are denoted by same reference numerals with no description provided for them. It is to be noted that this embodiment can be arbitrarily combined with another embodiment. In particular, if the shield plate 35 of this tenth embodiment is arranged outside the heating chamber at the entrance of the first preparatory chamber and the exit of the second reflow heating chamber 7b (see FIG. 19) and the shield plates 217a and 217b of the fourth embodiment are arranged inside the heating chamber at the entrance of the first preparatory chamber and the exit of the second reflow heating chamber 7b, then the effects of both the embodiments can be synergistically produced.

Figure 31:
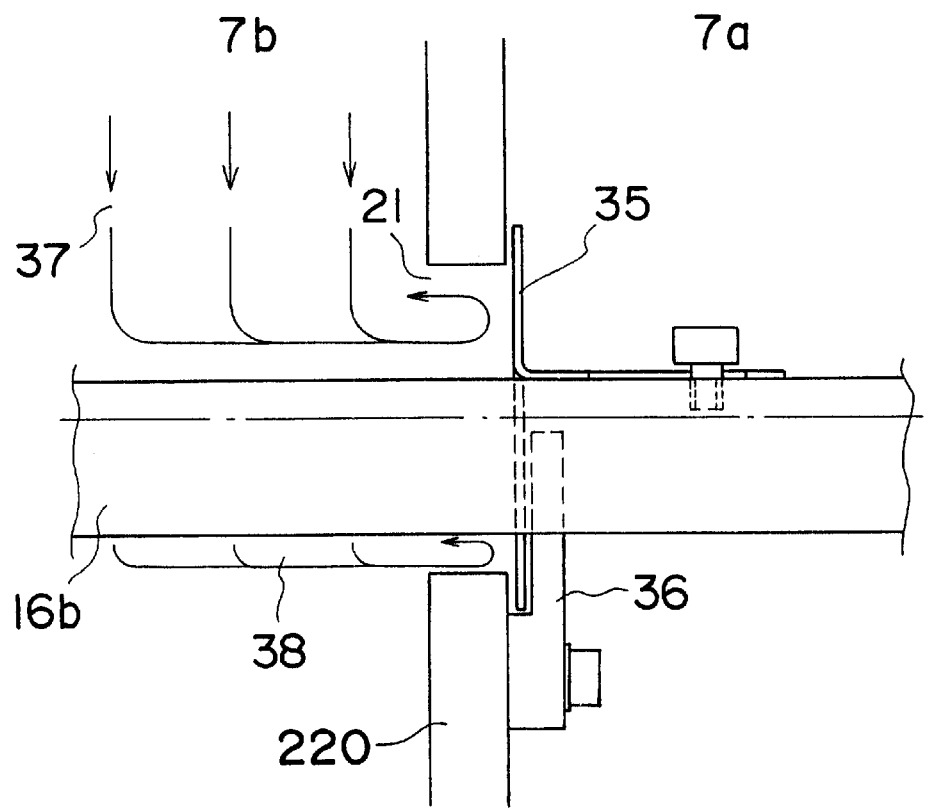
FIG. 31 is a front view of part of the conveyance section of a reflow apparatus according to a tenth embodiment of the present invention.
Figure 32:
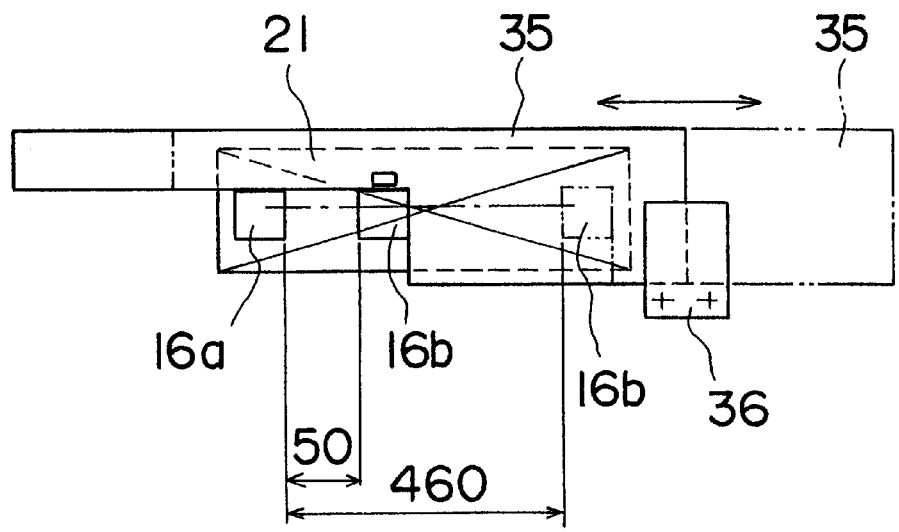
FIG. 32 is a side view of the conveyance section of FIG. 31.

According to the aforementioned construction, in FIG. 31, paths 37 of the heated air flowing along the upper surfaces of the rail sections are blocked by the shield plate 35, and heated air 38 flowing through a space having no relation to the board conveyance in the opening 21 can also be reduced without hindering the opening 21 except for the upper surfaces of the rail sections, i.e., without hindering the conveyance of the board 2. Therefore, the same operation as that of the fourth embodiment can be obtained, and more stable circulating air can be obtained while restraining the thermal interference between the heating chamber and the outside of the heating chamber. In particular, the smaller the size of the circuit board 2 is, the larger the unnecessary space in the opening 21 is. Therefore, the effect of closing the unnecessary space with the shield plate 35 is great. That is, the opening area through which the board 2 is loaded and unloaded between the heating chamber and the outside of the heating chamber can be restrained to the necessary minimum, and the thermal interference due to the flow of the heated gas heated to the specified temperature in the heating chamber along the upper surfaces of the rail sections between the heating chamber and the outside of the heating chamber can be reduced. Accordingly, the board 2 can be stably heated to the specified temperature, allowing the heat treatment to be executed with high reliability.

Figure 35:
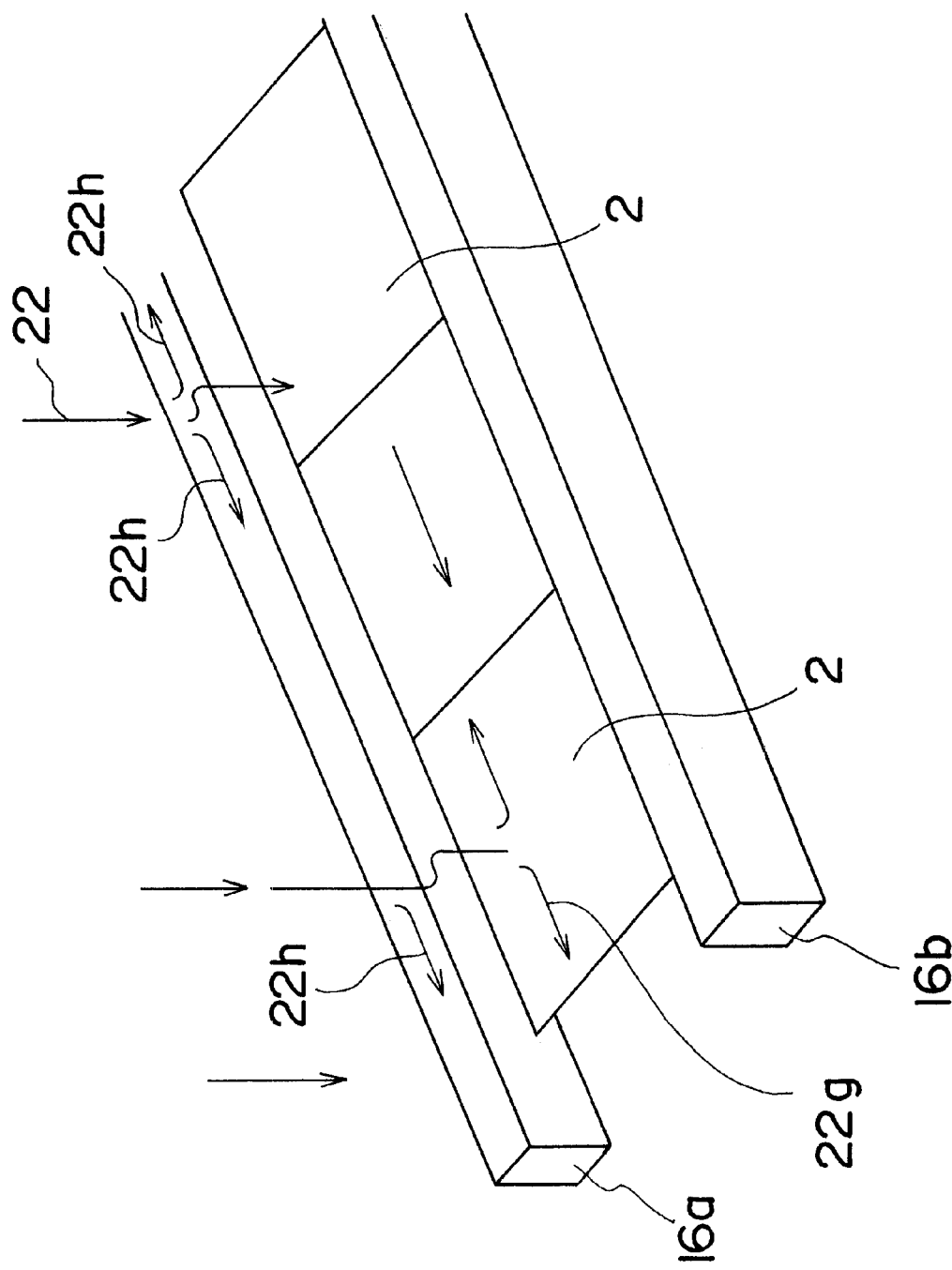
FIG. 35 is a perspective view for explaining the flow of heated air in a reflow apparatus.
Figure 36:
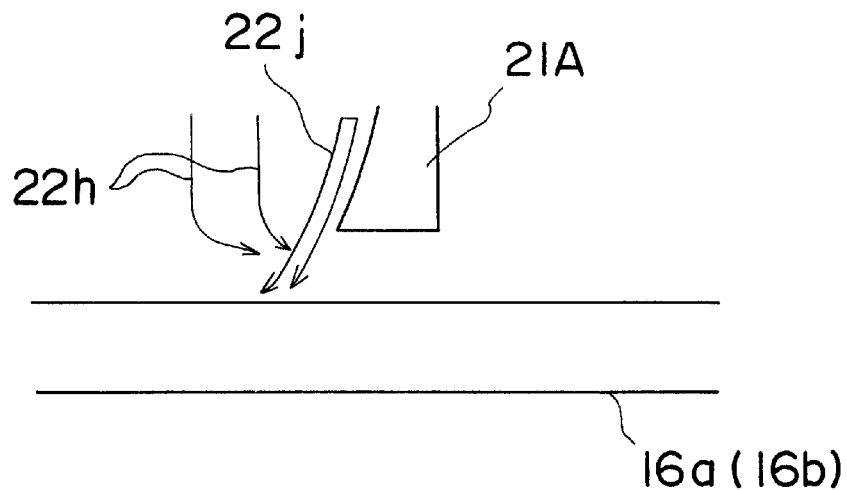
FIG. 36 is a schematic side view of yet another embodiment of the present invention.

Further, as shown in FIG. 36, another example of the heated gas flow path control member may change the flow of the heated air instead of blocking the path of the heated air in the heating chamber. That is, it is acceptable to form the inner surface, which is located on the heating chamber side and belongs to a partition wall 21A for partitioning between the heating chamber and the outside of the heating chamber, into a curved surface for the construction of the heated gas flow path control member so as to form a flow of the heated air flowing along the partition wall 21A as indicated by an arrow 22j toward the heating chamber side in the rail sections 16a and 16b, changing to the inside of the heating chamber the path of the heated air that collides against the rail sections 16a and 16b inside the heating chamber and tries to flow outwardly of the heating chamber as indicated by an arrow 22h shown in FIG. 35.

Figure 37:
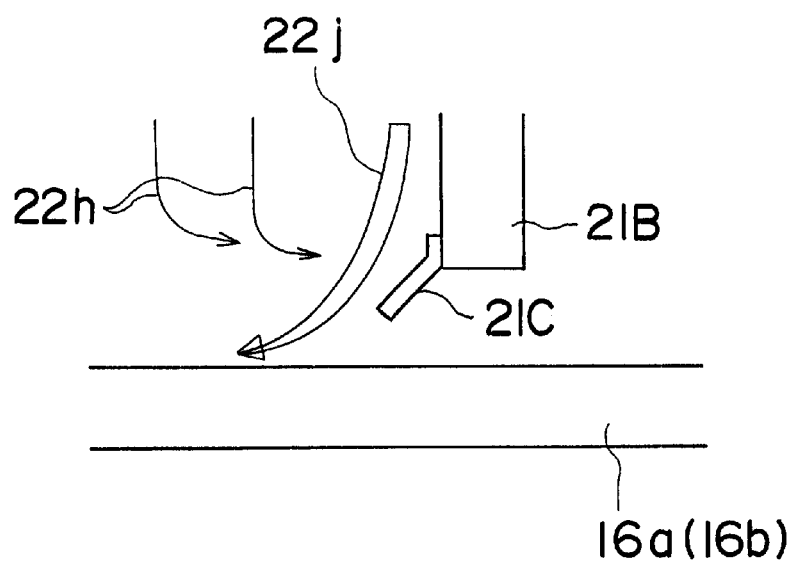
FIG. 37 is a schematic side view of yet another embodiment of the present invention.

As shown in FIG. 37, according to a modification example of FIG. 36, it is acceptable to arrange a heated gas flow path changing plate 21C that protrudes toward the heating chamber and serves as the heated gas flow path control member at the lower end portion of a partition wall 21B for partitioning between the heating chamber and the outside of the heating chamber so as to form a flow of the heated air that is flowing along the partition wall 21B and further flowing along the heated gas flow path changing plate 21C as indicated by an arrow 22j toward the heating chamber in the rail sections 16a and 16b, changing to the inside of the heating chamber the paths of the heated air that collides against the rail sections 16a and 16b inside the heating chamber and tries to flow outwardly of the heating chamber as indicated by an arrow 22h shown in FIG. 35 and FIG. 36.

The reflow apparatuses and methods of the aforementioned embodiments of the present invention can obtain the effects of reducing or blocking the heated air flowing toward the adjacent chamber along the upper surfaces of the rail sections, reducing the thermal interference between the chambers of the preheating chambers, the heating chambers, the cooling chamber, and between the chambers and the environmental atmospheres, reducing the consumption power, and stably heating the circuit board to the specified temperature by providing a shield plate between the chambers of the preheating chambers, the heating chambers, the cooling chamber inside the furnace section and between them and the environmental atmospheres or making the rail sections have mountain-like cross-section shapes. Furthermore, the quantity of supply heat can be reduced in the apparatus for heating the heated gas, and a heating apparatus and method whose consumption power is reduced can be realized.

As described above, each of the aforementioned embodiments is not limited to the board on which the components are mounted. By applying each embodiment to the heat treatment of, for example, a wafer to which an interposing substrate is bonded in a wafer state via bonding materials such as solder bumps or a wafer that has bonding materials such as bumps for mounting a component in a state in which no component is mounted and changing to the inside of the heating chamber the flow path of the heated gas that tries to advance from the heating chamber toward the outside of the heating chamber between the heating chamber inside the furnace section and the outside of the heating chamber in an optimum state for the board, wafer, component, bonding material, and so on, there can be obtained the effects of reducing or blocking the heated gas that flows along the upper surfaces of the rail sections from the heating chamber toward the outside of the heating chamber, reducing the thermal interference between the heating chamber and the outside of the heating chamber, reducing the consumption power, and stably heating the mounting base object to the specified temperature. Therefore, in the control operation for changing the flow path of the heated gas to the inside of the heating chamber by the heating apparatus and heating method, the heating control can also be executed with high accuracy taking the heat resistance temperature of the bonding base object such as a board or a component into consideration, and the occurrence of a large warp of the bonding base object such as a wafer due to heat can also be restrained. The bonding material such as solder or adhesive that serves as the object to be heated can also be subjected to heating control with high accuracy at the optimum temperatures thereof.

According to an experiment, by concurrently putting the fourth embodiment and the fifth embodiment into practice, the consumption power could be reduced by a power of 0.3 kW than when not.

By changing to the inside of the heating chamber the flow path of the heated gas that tries to advance from the heating chamber toward the outside of the heating chamber between the heating chamber inside the furnace section and the outside of the heating chamber, the heating apparatus and heating method of the present invention obtains the effects of reducing or blocking the heated gas that flows along the upper surface of the rail section from the heating chamber toward the outside of the heating chamber, reducing the thermal interference between the heating chamber and the outside of the heating chamber, reducing the consumption power, and stably heating the bonding base object to the specified temperature.

According to the present invention, in at least either one of the pair of rail sections of the conveyance section, the flow path of the heated gas that tries to advance from the heating chamber toward the outside of the heating chamber is changed to the inside of the heating chamber at the boundary between the heating chamber and the outside of the heating chamber. With this arrangement, the thermal interference due to the flow of the heated gas heated to the specified temperature in each heating chamber, along the upper surface of the rail section between the heating chamber and the outside of the heating chamber can be reduced, and the bonding base object can be stably heated to the specified temperature, allowing the heat treatment to be executed with high reliability. Furthermore, the quantity of supply heat can be reduced in the apparatus for heating the heated gas, and the heating apparatus and method of a reduced consumption power can be realized.

In the present invention, the flow path of the heated gas that tries to advance from the heating chamber toward the outside of the heating chamber can also be changed to the inside of the heating chamber along the curved surface of the shield plate by means of the shield plate that has the concave surface curved toward the outside of the heating chamber in the conveyance direction of the bonding base object in the heated gas flow path control stage. As described above, by the curved shape of the shield plate, the blocked heated gas can be put back to each chamber without stagnation, and the bonding base object can be stably heated to the specified temperature, allowing the heat treatment to be executed with high reliability. Furthermore, the quantity of supply heat can be reduced in the apparatus for heating the heated gas, and the heating apparatus and heating method of a reduced consumption power can be realized.

The present invention can also restrain the heat conduction from the heated gas toward the outside of the heating chamber by means of the heat insulator of the shield plate when changing to the inside of the heating chamber the flow path of the heated gas that tries to advance from the heating chamber toward the outside of the heating chamber in the heated gas flow path control stage. In this case, the thermal interference due to the flow of the heated gas heated to the specified temperature in the heating chamber along the upper surface of the rail section between the heating chamber and the outside of the heating chamber can be reduced, and the thermal conduction between the heating chamber and the outside of the heating chamber via the shield plate can be additionally reduced. The bonding base object can be stably heated to the specified temperature, and the heat treatment can be executed with high reliability. Furthermore, the quantity of supply heat can be reduced in the apparatus for heating the heated gas, and the heating apparatus and heating method of a reduced consumption power can be realized.

According to the present invention, in at least either one of the pair of rail sections of the conveyance section, by flowing the heated gas downward from above along the mountain-like shape of the cross section of the upper portion in the heated gas flow path control stage, the heated gas can be blocked from flowing toward the outside of the heating chamber along the upper surface of the rail section. With this arrangement, the heated gas heated to the specified temperature in the heating chamber can be flowed downward from above along the mountain-like shape of the rail section. The thermal interference due to the flow of the heated gas along the upper surface of the rail section between the heating chamber and the outside of the heating chamber can be reduced, and the bonding base object can be stably heated to the specified temperature, allowing the heat treatment to be executed with high reliability. Furthermore, the quantity of supply heat can be reduced in the apparatus for heating the heated gas, and the heating apparatus and heating method of a reduced consumption power can be realized.

According to the present invention, in at least either the rail section of the pair of rail sections of the conveyance section, the upper surface is sloped so as to be lowered toward the opposite side of the bonding base object conveyed by the rail sections of the conveyance section, and the heated gas flows downward from above along the slope of the upper surface of the one rail section in the heated gas flow path control stage, by which the heated gas can be blocked from flowing toward the outside of the heating chamber along the upper surface of the rail section. With this arrangement, the heated gas heated to the specified temperature in the heating chamber can be flowed from the upper portion to the lower portion along the shape of the rail section without being blocked by the rail section, and only the heated gas just above the bonding base object can be uniformly applied to the bonding base object. Accordingly, variations in temperature throughout the entire surface of the bonding base object can be reduced, allowing heating to be uniformly performed. Therefore, the thermal interference due to the flow of the heated gas along the upper surface of the rail section between the heating chamber and the outside of the heating chamber can be reduced, and the bonding base object can be stably heated to the specified temperature, allowing the heat treatment to be executed with high reliability. Furthermore, the quantity of supply heat can be reduced in the apparatus for heating the heated gas, and the heating apparatus and heating method of a reduced consumption power can be realized.

According to the present invention, at least either one rail section of the pair of rail sections of the conveyance section is fixed, and the other rail section is the movable rail section arranged movably in the direction in which the movable rail section moves close to or apart from the fixed rail section according to the width dimension of the bonding base object. In the heated gas flow path control stage, the region that belongs to the opening for conveying the bonding base object in the heating chamber and has no relation to the bonding base object conveyance can be closed by the shield plate connected so as to move integrally with the movable rail section. With this arrangement, the area of the opening through which the bonding base object is loaded and unloaded between the heating chamber and the outside of the heating chamber can be restrained to the necessary minimum. The thermal interference due to the flow of the heated gas heated to the specified temperature in the heating chamber along the upper surface of the rail section between the heating chamber and the outside of the heating chamber can be reduced, and the bonding base object can be stably heated to the specified temperature, allowing the heat treatment to be executed with high reliability. Furthermore, the quantity of supply heat can be reduced in the apparatus for heating the heated gas, and the heating apparatus and heating method of a reduced consumption power can be realized.

When controlling the flow rate of the heated gas in either one or a plurality of embodiments of the first through third embodiments by combining either one or a plurality of embodiments of the first through third embodiments with either one or a plurality of embodiments of the fourth through tenth embodiments, the flow of the heated gas from the heating chamber toward the outside of the heating chamber can be restrained, and the accuracy of the flow rate control of the heated gas can be further improved, allowing the consumption power to be more effectively reduced.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A heating apparatus capable of heating an object such that an electronic component is bonded to a bonding base object via the object, said heating apparatus comprising:

a conveyance section operable to convey the bonding base object in a conveyance direction, said conveyance section comprising a pair of rail sections;

a heating chamber to heat the object, said heating chamber being operable to supply a gas at a specified flow rate as a heating source, said heating chamber being operable to supply the gas in a bonding base object direction, which intersects the conveyance direction;

a heating device constructed and arranged to heat the gas to a specified temperature;

a heated gas flow path control member comprising a shield plate, said heated gas flow path control member being disposed on one of said pair of rail sections at a position between an inside of said heating chamber and an outside of said heating chamber, said heated gas flow path control member operable to block heated gas from escaping to the outside of said heating chamber by changing a flow path of the heated gas from a first flow path to a second flow path, the first flow path having a first direction of flow from the inside of said heating chamber to the outside of said heating chamber, the second flow path having a second direction of flow from the outside of said heating chamber to the inside of said heating chamber; and a gas supply heat quantity control unit operable to set a quantity of heat of the gas to a first quantity of heat when heat treatment for the object is not required and to set the quantity of heat of the gas to a second quantity of heat when heat treatment for the object is required such that the first quantity of heat is smaller than the second quantity of heat, wherein a first portion of the gas supplied in the bonding base object direction is supplied onto the bonding base object, wherein a second portion of the gas supplied in the bonding base object direction is supplied beyond the bonding base object, and wherein said heating chamber is further operable to direct the second portion of the gas to said heating device such that the second portion of the gas is reheated, thereby internally recirculating the gas.

2. The heating apparatus as claimed in claim 1, wherein said gas supply heat quantity control unit is further operable to increase the quantity of heat of the gas when a temperature of said heating chamber is changed from a first heating chamber temperature to a second heating chamber temperature higher than the first heating chamber temperature.

3. The heating apparatus as claimed in claim 1, wherein said gas supply heat quantity control unit comprises a gas flow rate control unit, and wherein said gas flow rate control unit is further operable to increase the quantity of heat of the gas by increasing a supply flow rate of the gas when a temperature of said heating chamber is changed from a first heating chamber temperature to a second heating chamber temperature higher than the first heating chamber temperature.

4. The heating apparatus as claimed in claim 1, further comprising:

a bonding base object detecting unit operable to detect a passing of the bonding base object through an entrance of said heating apparatus and a passing of the bonding base object through an exit of said heating apparatus to thereby detect a presence of the bonding base object in said heating apparatus or an absence of the bonding base object in said heating apparatus, wherein said gas supply heat quantity control unit is further operable to determine that heat treatment for the object is required upon detection of the presence of the bonding base object inside said heating apparatus and that heat treatment for the object is not required upon detection of the absence of the bonding base object inside said heating apparatus, and wherein the first quantity of heat is a standby quantity heat.

5. The heating apparatus as claimed in claim 4, wherein said gas supply heat quantity control unit comprises a gas supply flow rate control section operable to set a gas supply flow rate to control the quantity of supply heat of the gas, wherein the gas supply flow rate is a standby gas supply flow rate when heat treatment for the object is not required, and wherein the gas supply flow rate is a second gas supply flow rate when heat treatment for the object is required such that the second gas supply flow rate is greater than the standby gas supply flow rate.

6. The heating apparatus as claimed in claim 4, wherein said gas supply heat quantity control unit comprises a gas temperature control section operable to control the quantity of supply heat of the gas to heat the gas to a gas temperature, wherein the gas temperature is a standby temperature when heat treatment for the object is not required, and wherein the gas temperature is a second temperature when heat treatment for the object is required such that the second temperature is greater than the standby temperature.

7. The heating apparatus as claimed in claim 1, wherein said shield plate has a curved convex surface that is curved toward the outside of said heating chamber in the conveyance direction, and wherein said curved convex surface is operable to change the flow path, at a position between an inside of said heating chamber and an outside of said heating chamber, of the heated gas from the first flow path to a third flow path along said curved convex surface.

8. The heating apparatus as claimed in claim 1, wherein one of said pair of rail sections is movable in a direction toward, and a direction away from, the other of said pair of rail sections to accommodate a width of the bonding base object, wherein said heated gas flow path control member is connected to said movable rail section such that said heated gas flow path control member is concurrently movable with said movable rail section, and wherein said heated gas flow path control member comprises a shield plate capable of closing a region within said heating chamber, the region having no relation to an opening for a conveyance of the bonding base object.

9. The heating apparatus as claimed in claim 1, wherein said heated gas flow path control member comprises a heat insulator capable of restraining conduction of heat from the gas to the outside of said heating chamber.

10. The heating apparatus as claimed in claim 1, wherein said heated gas flow path control member comprises a tapered upper portion of one of said pair of rail sections, said tapered upper portion having a cross section that is tapered in a tapering direction, and wherein said tapered upper portion is capable of causing a third portion of the gas supplied in a direction of the bonding base object to flow along the tapering direction to thereby block the third portion of the gas from flowing toward the outside of said heating chamber along an upper surface of said one of said pair of rail sections.

11. The heating apparatus as claimed in claim 1, wherein said heated gas flow path control member comprises a sloped upper portion of one of said pair of rail sections, said sloped upper portion having a cross section that is sloped in a sloping direction.

12. The heating apparatus as claimed in claim 1, wherein said heated gas flow path control member further comprises a partition wall disposed on said one of said pair of rail sections, said partition wall is arranged at a boundary between said heating chamber and the outside of said heating chamber.

13. The heating apparatus as claimed in claim 1, wherein said heating device is operable to heat the gas to a specified temperature that is sufficient to bond the electronic component to the bonding base object via the object when the object is a bonding material.

14. The heating apparatus as claimed in claim 1, wherein said heating device is operable to heat the gas to a specified temperature that is sufficient to bond the electronic component to the bonding base object via the object when the object is a solder or an electronic component fixing-thermosetting adhesive or that is sufficient to encapsulate the electronic component when the object is an electronic component encapsulating resin.

15. A heating apparatus capable of heating an object such that an electronic component is bonded to a bonding base object via the object, said heating apparatus comprising:
- a conveyance section operable to convey the bonding base object in a conveyance direction, said conveyance section comprising a pair of rail sections;
- a heating chamber to heat the object, said heating chamber being operable to supply a gas at a specified flow rate as a heating source, said heating chamber being operable to supply the gas in a bonding base object direction, which intersects the conveyance direction;
- a heating device constructed and arranged to heat the gas to a specified temperature;
- a heated gas flow path control member comprising a shield plate, said heated gas flow path control member being disposed on one of said pair of rail sections at a position between an inside of said heating chamber and an outside of said heating chamber, said heated gas flow path control member operable to block heated gas from escaping to the outside of said heating chamber by changing a flow path of the heated gas from a first flow path to a second flow path, the first flow path having a first direction of flow from the inside of said heating chamber to the outside of said heating chamber, the second flow path having a second direction of flow from the outside of said heating chamber to the inside of said heating chamber; and
- a gas supply heat quantity control unit operable to set a supply heat quantity of the gas to a first supply heat quantity when a temperature of said heating chamber is not set to be changed and operable to change the supply heat quantity of the gas from the first supply heat quantity to a second supply heat quantity when a temperature of said heating chamber is set to be changed,
- wherein a first portion of the gas supplied in the bonding base object direction is supplied onto the bonding base object,
- wherein a second portion of the gas supplied in the bonding base object direction is supplied beyond the bonding base object, and
- wherein said heating chamber is further operable to direct the second portion of the gas to said heating device such that the second portion of the gas is re-heated, thereby internally recirculating the gas.

16. The heating apparatus as claimed in claim 15, further comprising:
- a bonding base object detecting unit operable to detect a passing of the bonding base object through an entrance of said heating apparatus and a passing of the bonding base object through an exit of said heating apparatus to thereby detect a presence of the bonding base object in said heating apparatus or an absence of the bonding base object in said heating apparatus,
- wherein said gas supply heat quantity control unit is further operable to determine that heat treatment for the object is required upon detection of the presence of the bonding base object inside said heating apparatus and that heat treatment for the object is not required upon detection of the absence of the bonding base object inside said heating apparatus, and
- wherein the first supply heat quantity is a standby supply heat quantity and is lower than the second supply heat quantity.

17. The heating apparatus as claimed in claim 16, wherein said gas supply heat quantity control unit comprises a gas supply flow rate control section operable to set a gas supply flow rate to control the quantity of supply heat of the gas,
- wherein the gas supply flow rate is a standby gas supply flow rate when heat treatment for the object is not required, and
- wherein the gas supply flow rate is a second gas supply flow rate when heat treatment for the object is required such that the second gas supply flow rate is greater than the standby gas supply flow rate.

18. The heating apparatus as claimed in claim 16, wherein said gas supply heat quantity control unit comprises a gas temperature control section operable to control the quantity of supply heat of the gas to heat the gas to a gas temperature,
- wherein the gas temperature is a standby temperature when heat treatment for the object is not required, and
- wherein the gas temperature is a second temperature when heat treatment for the object is required such that the second temperature is greater than the standby temperature.

19. The heating apparatus as claimed in claim 15, wherein said heating device is operable to heat the gas to a specified temperature that is sufficient to bond the electronic component to the bonding base object via the object when the object is a bonding material.

20. The heating apparatus as claimed in claim 15, wherein said heating device is operable to heat the gas to a specified temperature that is sufficient to bond the electronic component to the bonding base object via the object when the object is a solder or an electronic component fixing-thermosetting adhesive or that is sufficient to encapsulate the electronic component when the object is an electronic component encapsulating resin.

21. A method of heating an object such that an electronic component is bonded to a bonding base object via the object, said method comprising:
- conveying the bonding base object in a conveyance direction through a heating chamber;
- heating a gas to a specified temperature via a heating device;
- supplying the heated gas, at a specified flow rate, from the heating device and into the heating chamber in a bonding base object direction, which intersects the conveyance direction;
- setting a quantity of heat of the heated gas to a first quantity of heat when heat treatment for the object is not required and setting the quantity of heat of the heated gas to a second quantity of heat when heat treatment for the object is required such that the first quantity of heat is smaller than the second quantity of heat; and
- directing a first portion of the heated gas supplied into the heating chamber to the heating device thereby internally recirculating the heated gas,
- wherein said supplying the heated gas comprises supplying a second portion of the heated gas supplied in a bonding base object direction onto the bonding base object and supplying the first portion of the heated gas supplied in a bonding base object direction beyond the bonding base object,
- wherein said conveying the bonding base object comprises conveying the bonding base object via a pair of rail sections, and
- wherein said supplying the heated gas comprises changing a flow path, via a heated gas flow path control member disposed on one of the pair of rail sections at a position between an inside of the heating chamber and an outside of the heating chamber, of the heated gas from a first flow path having a direction from the inside of the heating chamber to the outside of the heating chamber to a second flow path having a direction from the outside of the heating chamber to the inside of the heating chamber.

22. The method as claimed in claim 21, wherein said setting a quantity of heat of the heated gas further comprises increase the quantity of heat of the heated gas when a temperature of the heating chamber is changed from a first heating chamber temperature to a second heating chamber temperature higher than the first heating chamber temperature.

23. The method as claimed in claim 21, wherein said setting a quantity of heat of the heated gas further comprises controlling a gas flow rate of the supplied heated gas, and wherein said controlling a gas flow rate of the supplied heated gas comprises increasing the quantity of heat of the gas by increasing a supply flow rate of the gas when a temperature of the heating chamber is changed from a first heating chamber temperature to a second heating chamber temperature higher than the first heating chamber temperature.

24. The method as claimed in claim 21, further comprising:

detecting a passing of the bonding base object through an entrance of the heating chamber and a passing of the bonding base object through an exit of the heating chamber to thereby detect a presence of the bonding base object in the heating chamber or an absence of the bonding base object in the heating chamber, wherein said setting a quantity of heat of the heated gas further comprises determining that heat treatment for the object is required upon detection of the presence of the bonding base object inside the heating chamber and that heat treatment for the object is not required upon detection of the absence of the bonding base object inside the heating chamber, and wherein the first quantity of heat is a standby quantity heat.

25. The method as claimed in claim 24, wherein said setting a quantity of heat of the heated gas comprises setting a gas supply flow rate to control th e quantity of supply heat of the gas, wherein the gas supply flow rate is the standby gas supply flow rate when heat treatment for the object is not required, and wherein the gas supply flow rate is a second gas supply flow rate when heat treatment for the object is required such that the second gas supply flow rate is greater than the standby gas supply flow rate.

26. The method as claimed in claim 24, wherein said setting a quantity of heat of the heated gas further comprises controlling the quantity of supply heat of the gas to heat the gas to a gas temperature, wherein the gas temperature is the standby temperature when heat treatment for the object is not required, and wherein the gas temperature is a second temperature when heat treatment for the object is required such that the second temperature is greater than the standby temperature.

27. A method of heating an object such that an electronic component is bonded to a bonding base object via the object, said method comprising:

conveying the bonding base object in a conveyance direction through a heating chamber;

heating a gas to a specified temperature via a heating device;

supplying the heated gas, at a specified flow rate, from the heating device and into the heating chamber in a bonding base object direction, which intersects the conveyance direction;

setting a quantity of heat of the heated gas to a first quantity of heat when a temperature of the heating chamber is not set to be changed and setting the quantity of heat of the heated gas to a second quantity of heat when the temperature of the heating chamber is set to be changed such that the first quantity of heat is smaller than the second quantity of heat; and directing a first portion of the heated gas supplied into the heating chamber to the heating device thereby internally recirculating the heated gas, wherein said supplying the heated gas comprises supplying a second portion of the heated gas supplied in a bonding base object direction onto the bonding base object and supplying the first portion of the heated gas supplied in a bonding base object direction beyond the bonding base object, wherein said conveying the bonding base object comprises conveying the bonding base object via a pair of rail sections, and wherein said supplying the heated gas further comprises changing a flow path, via a heated gas flow path control member disposed on one of the pair of rail sections at a position between an inside of the heating chamber and an outside of the heating chamber, of the heated gas from a first flow path having a direction from the inside of the heating chamber to the outside of the heating chamber to a second flow path having a direction from the outside of the heating chamber to the inside of the heating chamber.

28. The method as claimed in claim 27, further comprising:

detecting a passing of the bonding base object through an entrance of the heating chamber and a passing of the bonding base object through an exit of the heating chamber to thereby detect a presence of the bonding base object in the heating chamber or an absence of the bonding base object in the heating chamber, wherein said setting a quantity of heat of the heated gas further comprises determining that heat treatment for the object is required upon detection of the presence of the bonding base object inside the heating chamber and that heat treatment for the object is not required upon detection of the absence of the bonding base object inside the heating chamber, and wherein the first quantity of heat is a standby quantity heat.

29. The method as claimed in claim 28, wherein said setting a quantity of heat of the heated gas comprises setting a gas supply flow rate to control the quantity of supply heat of the gas, wherein the gas supply flow rate is a standby gas supply flow rate when heat treatment for the object is not required, and wherein the gas supply flow rate is a second gas supply flow rate when heat treatment for the object is required such that the second gas supply flow rate is greater than the standby gas supply flow rate.

30. The method as claimed in claim 28, wherein said setting a quantity of heat of the heated gas further comprises controlling the quantity of supply heat of the gas to heat the gas to a gas temperature, wherein the gas temperature is a standby temperature when heat treatment for the object is not required, and wherein the gas temperature is a second temperature when heat treatment for the object is required such that the second temperature is greater than the standby temperature.

31. The method as claimed in claim 27, wherein said supplying the heated gas further comprises blocking the gas having the first flow path with the heated gas flow path control member which comprises a shield plate disposed adjacent to the one of the pair of rail sections and at the position between the inside of the heating chamber and the outside of the heating chamber.

32. The method as claimed in claim 27, wherein said supplying the heated gas further comprises:

blocking the gas having the first flow path with the heated gas flow path control member which comprises a shield plate disposed adjacent to the one of the pair of rail sections and at the position between the inside of the heating chamber and the outside of the heating chamber, the shield plate having a curved convex surface that is curved toward the outside of the heating chamber in the conveyance direction, and changing the flow path, at a position between an inside of the heating chamber and an outside of the heating chamber, of the heated gas from the first flow path to a third flow path along said curved convex surface via the curved convex surface.

33. The method as claimed in claim 27, wherein said conveying the bonding base object further comprises moving one of the pair of rail sections in a direction toward, or a direction away from, the other of the pair of rail sections to accommodate a width of the bonding base object, and wherein said changing a flow path further comprises moving the heated gas flow path control member, which is connected to the movable rail section, and which comprises a shield plate capable of closing a region within the heating chamber, the region having no relation to an opening for a conveyance of the bonding base object.

34. The method as claimed in claim 27, wherein said changing a flow path comprises changing a flow path via a heated gas flow path control member that further comprises a partition wall disposed on the one of the pair of rail sections.

35. The method as claimed in claim 27, wherein said heating a gas comprises heating a gas to a specified temperature that is sufficient to bond the electronic component to the bonding base object via the object when the object is a bonding material.

36. The method as claimed in claim 27, wherein said heating a gas comprises heating a gas to a specified temperature that is sufficient to bond the electronic component to the bonding base object via the object when the object is a solder or an electronic component fixing-thermosetting adhesive or that is sufficient to encapsulate the electronic component when the object is an electronic component encapsulating resin.

37. A heating apparatus capable of heating an object such that an electronic component is bonded to a bonding base object via the object, said heating apparatus comprising:

a conveyance section operable to convey the bonding base object in a conveyance direction, said conveyance section comprising a pair of rail sections;

a heating chamber operable to supply a heated gas to the object thereby heating the object; and a heated gas flow path control member comprising a shield plate and operable to block a flow path of the heated gas having a direction of flow from the inside of said heating chamber to the outside of said heating chamber, said heated gas flow path control member being disposed on one of said pair of rail sections at a position between an inside of said heating chamber and an outside of said heating chamber.

38. The heating apparatus as claimed in claim 37, wherein said shield plate has a curved convex surface that is curved toward the outside of said heating chamber in the conveyance direction, and wherein said curved convex surface is operable to change the flow path, at a position between an inside of said heating chamber and an outside of said heating chamber, of the heated gas from the first flow path to a third flow path along said curved convex surface.

39. The heating apparatus as claimed in claim 37, wherein one of said pair of rail sections is movable in a direction toward, and a direction away from, the other of said pair of rail sections to accommodate a width of the bonding base object, wherein said heated gas flow path control member is connected to said movable rail section such that said heated gas flow path control member is concurrently movable with said movable rail section, and wherein said heated gas flow path control member comprises a shield plate capable of closing a region within said heating chamber, the region having no relation to an opening for a conveyance of the bonding base object.

40. The heating apparatus as claimed in claim 37, wherein said heated gas flow path control member comprises a heat insulator capable of restraining conduction of heat from the heated gas to the outside of said heating chamber.

41. The heating apparatus as claimed in claim 37, wherein said heated gas flow path control member comprises a tapered upper portion of one of said pair of rail sections, said tapered upper portion having a cross section that is tapered in a tapering direction, and wherein said tapered upper portion is arranged such that capable of causing a third portion of the gas supplied in a direction of the bonding base object to flow along the tapering direction to thereby block the third portion of the gas from flowing toward the outside of said heating chamber along an upper surface of said one of said pair of rail sections.

42. The heating apparatus as claimed in claim 37, wherein said heated gas flow path control member comprises a sloped upper portion of one of said pair of rail sections, said sloped upper portion having a cross section that is sloped in a sloping direction.

43. The heating apparatus as claimed in claim 37, wherein said heated gas flow path control member further comprises a partition wall disposed on said one of said pair of rail sections, said partition wall is arranged at a boundary between said heating chamber and the outside of said heating chamber.

44. The heating apparatus as claimed in claim 37, wherein said heating device is operable to heat the gas to a specified temperature that is sufficient to bond the electronic component to the bonding base object via the object when the object is a bonding material.

45. The heating apparatus as claimed in claim 37, wherein said heating device is operable to heat the gas to a specified temperature that is sufficient to bond the electronic component to the bonding base object via the object when the object is a solder or an electronic component fixing-thermosetting adhesive or that is sufficient to encapsulate the electronic component when the object is an electronic component encapsulating resin.

46. The heating apparatus as claimed in claim 37, further comprising:

a second heated gas flow path control member comprising a second shield plate, wherein said heating chamber comprises a spare chamber and a heating use chamber, said spare chamber being operable to heat the object, said heating use chamber being disposed and being operable to heat the object subsequent to a heating by said spare chamber, wherein said heated gas flow path control member is disposed and an entrance of said spare chamber, and wherein said second heated gas flow path control member is disposed at an exit of said heating use chamber.

47. A method of heating an object such that an electronic component is bonded to a bonding base object via the object, said method comprising:

conveying the bonding base object in a conveyance direction via a pair of rail sections;

supplying a heated gas to the object via a heating chamber thereby heating the object; and blocking a heated gas flow path of the heated gas via a heated gas flow path control member comprising a shield plate, the heated gas flow path having a direction from the inside of the heating chamber to the outside of the heating chamber, the heated gas flow path control member being disposed on one of the pair of rail sections at a position between an inside of the heating chamber and an outside of the heating chamber.

48. The heating apparatus as claimed in claim 47, further comprising restraining, via a heat insulator within the shield plate, heat from conducting to the outside of the heating chamber from within the heating chamber.

49. The heating apparatus as claimed in claim 47, wherein said blocking a heated gas flow path of the heated gas comprises blocking a heated gas flow path of the heated gas via a heated gas flow path control member comprising a shield plate having a curved convex surface that is curved toward the outside of the heating chamber in the conveyance direction, and wherein said blocking a heated gas flow path of the heated gas further comprises changing the flow path, at a position between an inside of the heating chamber and an outside of the heating chamber, of the heated gas from the first flow path to a third flow path along said curved convex surface via the curved convex surface.

50. The heating apparatus as claimed in claim 47, wherein said conveying the bonding base object further comprises moving one of the pair of rail sections in a direction toward, or a direction away from, the other of the pair of rail sections to accommodate a width of the bonding base object, wherein said blocking a heated gas flow path of the heated gas further comprises moving the heated gas flow path control member, which is connected to the movable rail section, and which comprises a shield plate capable of closing a region within the heating chamber, the region having no relation to an opening for a conveyance of the bonding base object.

51. The heating apparatus as claimed in claim 47, wherein said blocking a heated gas flow path of the heated gas comprises blocking a heated gas flow path of the heated gas via a heated gas flow path control member comprising a tapered upper portion of one of the pair of rail sections, the tapered upper portion having a cross section that is tapered in a tapering direction, the tapered upper portion is capable of blocking gas from flowing toward the outside of the heating chamber along an upper surface of said one of the pair of rail sections.

52. The heating apparatus as claimed in claim 47, wherein said blocking a heated gas flow path of the heated gas comprises blocking a heated gas flow path of the heated gas via a heated gas flow path control member comprising a sloped upper portion of one of the pair of rail sections, the sloped upper portion having a cross section that is sloped in a sloping direction.

53. The heating apparatus as claimed in claim 47, wherein said blocking a heated gas flow path of the heated gas further comprises blocking a heated gas flow path of the heated gas via a heated gas flow path control member further comprising a partition wall disposed on one of the pair of rail sections, the partition wall is arranged at a boundary between the heating chamber and the outside of the heating chamber.

54. The heating apparatus as claimed in claim 47, wherein said supplying a heated gas comprises supplying a heated gas at a specified temperature that is sufficient to bond the electronic component to the bonding base object via the object when the object is a bonding material.

55. The heating apparatus as claimed in claim 47, wherein said supplying a heated gas comprises supplying a heated gas at a specified temperature that is sufficient to bond the electronic component to the bonding base object via the object when the object is a solder or an electronic component fixing-thermosetting adhesive or that is sufficient to encapsulate the electronic component when the object is an electronic component encapsulating resin.

* * * * *